(12) United States Patent
Lee et al.

(10) Patent No.: US 10,916,587 B2
(45) Date of Patent: Feb. 9, 2021

(54) IMAGE SENSOR

(71) Applicant: SAMSUNG ELECTRONICS CO., LTD., Suwon-si (KR)

(72) Inventors: Tae Yon Lee, Seoul (KR); Chang Hwa Kim, Hwaseong-si (KR); Jae Ho Kim, Seoul (KR); Sang Chun Park, Seoul (KR); Gwi Deok Ryan Lee, Suwon-si (KR); Beom Suk Lee, Yongin-si (KR); Jae Kyu Lee, Seongnam-si (KR); Kazunori Kakehi, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/443,233

(22) Filed: Jun. 17, 2019

(65) Prior Publication Data

US 2020/0119097 A1 Apr. 16, 2020

(30) Foreign Application Priority Data

Oct. 10, 2018 (KR) .................. 10-2018-0120525

(51) Int. Cl.
*H01L 27/30* (2006.01)
*H01L 27/28* (2006.01)

(52) U.S. Cl.
CPC .......... *H01L 27/307* (2013.01); *H01L 27/286* (2013.01)

(58) Field of Classification Search
CPC ... H01L 27/307; H01L 27/286; H01L 51/424; H04N 5/378; H04N 5/37452; H04N 5/3698

See application file for complete search history.

(56) References Cited

U.S. PATENT DOCUMENTS

| 2011/0019042 | A1* | 1/2011 | Yamaguchi | ....... H01L 27/14632 |
| | | | | 348/280 |
| 2015/0054995 | A1 | 2/2015 | Choo et al. | |
| 2016/0104734 | A1 | 4/2016 | Hirose et al. | |
| 2017/0170238 | A1 | 6/2017 | Lee et al. | |
| 2017/0170239 | A1 | 6/2017 | Lee et al. | |
| 2018/0076252 | A1 | 3/2018 | Togashi et al. | |
| 2018/0190697 | A1* | 7/2018 | Lee | .................. H01L 27/14609 |
| 2018/0301509 | A1* | 10/2018 | Ishii | .................. H01L 27/14627 |
| 2019/0371862 | A1* | 12/2019 | Muroyama | ......... H01L 51/0059 |

FOREIGN PATENT DOCUMENTS

KR 10-2013-0040439 A 4/2013

* cited by examiner

*Primary Examiner* — Fernando L Toledo
*Assistant Examiner* — Valerie N Newton
(74) *Attorney, Agent, or Firm* — Myers Bigel, P.A.

(57) ABSTRACT

An image sensor includes a first organic photoelectric conversion layer on a base layer, a floating diffusion region in the base layer, a first storage node including a first electrode layer, which is configured to receive a bias signal, a first portion of a first semiconductor layer which includes a semiconductor material, and a first portion of a first dielectric layer. The first dielectric layer extends between the first electrode layer and the first semiconductor layer. The first storage node is electrically connected to the first organic photoelectric conversion layer. The image sensor includes a first transfer transistor including the first dielectric layer, the first semiconductor layer, and a first transfer gate electrode which is configured to receive first transfer control signal. The first transfer transistor has a first end electrically connected to the first storage node and a second end electrically connected to the floating diffusion region.

20 Claims, 15 Drawing Sheets

FIG. 2
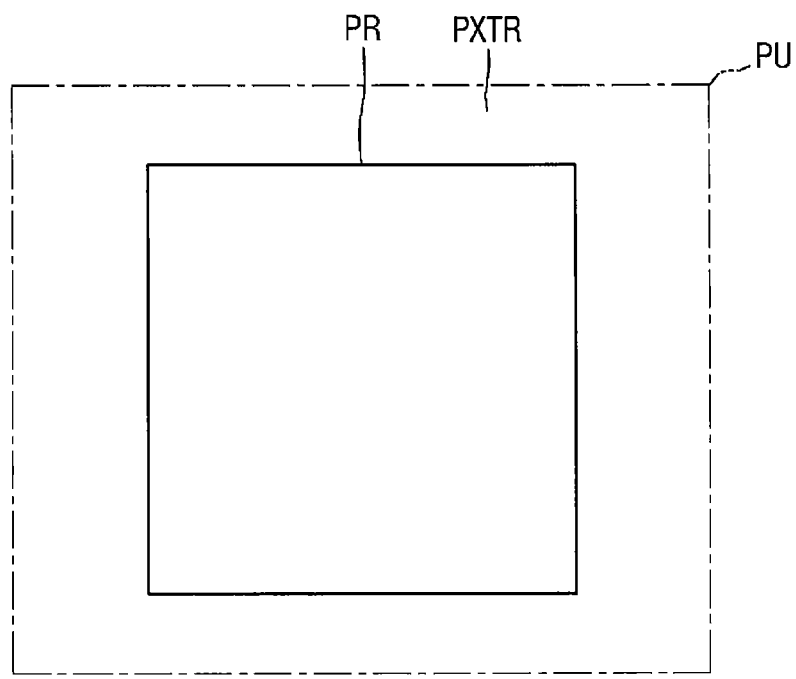
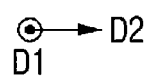

IMAGE SENSOR

CROSS REFERENCE TO RELATED APPLICATION

This U.S. non-provisional patent application claims priority under 35 U.S.C. § 119 to Korean Patent Application No. 10-2018-0120525, filed on Oct. 10, 2018, the disclosure of which is incorporated herein by reference in its entirety.

BACKGROUND

The present disclosure relates to an image sensor.

Image sensors are semiconductor devices that convert optical information into electrical signals. As semiconductor devices have become highly integrated, image sensors have also become highly integrated. Accordingly, a shared structure may be needed in which one or more pixel regions form a single unit pixel region and share pixel transistors. Meanwhile, each pixel region of a unit pixel region may include a semiconductor photoelectric conversion layer, and the unit pixel region may share an organic photoelectric conversion layer. In this case, transfer transistors corresponding to the semiconductor photoelectric conversion layer and the organic photoelectric conversion layer may be needed.

SUMMARY

Embodiments of the present inventive concept provide an image sensor which includes a storage node and a transfer transistor corresponding to an organic photoelectric conversion layer and can thus reduce noise by improving the mobility of electric charge.

However, embodiments of the present inventive concept are not restricted to those set forth herein. The above and other embodiments of the present inventive concept will become more apparent to one of ordinary skill in the art to which the present inventive concept pertains by referencing the detailed description of embodiments of the present inventive concept given below.

According to some embodiment of the present inventive concept, there is provided an image sensor including a first organic photoelectric conversion layer on a base layer, a floating diffusion region in the base layer, a first storage node including a first electrode layer which is configured to receive a bias signal, a first portion of a first semiconductor layer, and a first portion of a first dielectric layer extending between the first electrode layer and the first semiconductor layer, the first storage node is electrically connected to the first organic photoelectric conversion layer, and a first transfer transistor including a second portion of the first dielectric layer, the first semiconductor layer, and a first transfer gate electrode configured to receive a first transfer control signal. The first transfer transistor has a first end electrically connected to the first storage node and a second end electrically connected to the floating diffusion region.

According to the aforementioned and other embodiments of the present inventive concept, there is provided an image sensor including a first organic photoelectric conversion layer on a base layer, a first transfer gate electrode in the base layer, a first storage node in the base layer and including a first electrode layer, a first semiconductor layer, and a first dielectric layer which extends between the first electrode layer and the first semiconductor layer; and a penetrating electrode extending through the base layer to connect the first organic photoelectric conversion layer and the first storage node. The first electrode layer is spaced apart from the first transfer gate electrode, and the first dielectric layer and the first semiconductor layer are stacked on the first transfer gate electrode.

According to the aforementioned and other embodiments of the present inventive concept, there is provided an image sensor including a first photoelectric conversion layer on a base layer, an insertion layer between the base layer and the first organic photoelectric conversion layer, a first dielectric layer between the first organic photoelectric conversion layer and the insertion layer, a first semiconductor layer between the first dielectric layer and the first organic photoelectric conversion layer; a first penetrating electrode extending from the first semiconductor layer into the base layer to be connected to a first wire in the base layer, and a second penetrating electrode extending from the insertion layer into the base layer to be electrically connected to a second wire in the base layer, the second penetrating electrode being spaced apart from the first penetrating electrode.

Other features and embodiments may be apparent from the following detailed description, the drawings, and the claims.

BRIEF DESCRIPTION OF THE DRAWINGS

The above and other embodiments and features of the present inventive concept will become more apparent by describing in detail embodiments thereof with reference to the attached drawings, in which:

FIG. 2 is a layout view illustrating a unit pixel region of an image sensor according to some embodiments of the present inventive concept;

DETAILED DESCRIPTION

Figure 1:
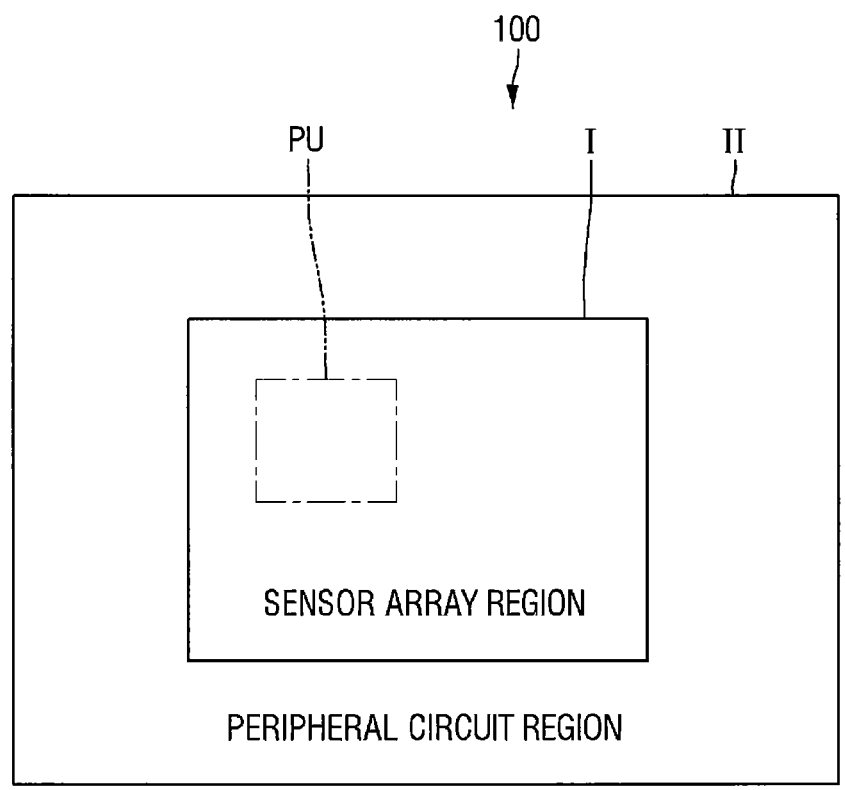
FIG. 1 is a schematic view illustrating a base layer of an image sensor according to some embodiments of the present inventive concept.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list. An image sensor according to some embodiments of the present inventive concept will hereinafter be described with reference to FIGS. 1 through 5. Referring to FIG. 1, a base layer 100 may include a sensor array region I and a peripheral circuit region II. The sensor array region I may be, for example, a region in which an active pixel sensor array capable of converting an optical signal into an electrical signal is formed. The active pixel sensor array may include a plurality of unit pixel regions. The plurality of unit pixel regions may include a unit pixel region PU. The peripheral circuit region II may be formed to surround the sensor array region I, but the present inventive concept is not limited thereto. The peripheral circuit region II may be, for example, a region in which a correlated double sampler capable of double-sampling a particular noise level and an electrical signal level and outputting the difference between the noise level and the electrical signal level and an analog-to-digital converter capable of converting an analog signal output by the correlated double sampler into a digital signal are formed.

Figure 3:
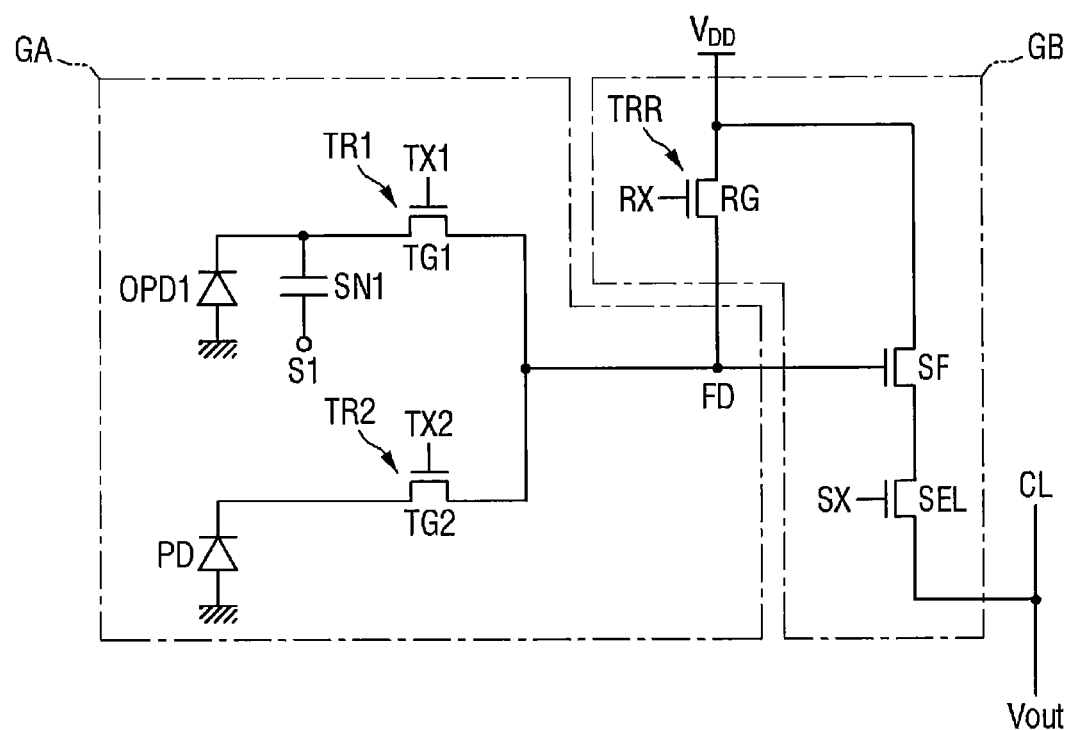
FIGS. 3, 8, and 12 are circuit diagrams of image sensors according to some embodiments of the present inventive concept.

FIG. 2 is an enlarged view of the unit pixel region PU, which is a part of the sensor array region I of FIG. 1. For clarity, elements other than the unit pixel region PU and a pixel transistor forming region PXTR are not illustrated in FIG. 2. Referring to FIGS. 2 and 3, the unit pixel region PU may include the pixel transistor forming region PXTR and at least one pixel region PR. The pixel transistor forming region PXTR may, for example, be around and/or surround the pixel region PR. The unit pixel region PU is illustrated in FIG. 2 as including a single pixel region PR, but the present inventive concept is not limited thereto. Alternatively, the unit pixel region PU may include multiple pixel regions, and the multiple pixel regions may be isolated from one another. The multiple pixel regions may share the pixel transistor forming region PXTR.

The unit pixel region PU may, for example, include a first storage node SN1, a semiconductor photoelectric conversion layer PD, a first organic photoelectric conversion layer OPD1, first and second transfer transistors TR1 and TR2, a floating diffusion region FD, a reset transistor TRR, a source follower transistor SF, and a select transistor SEL. It will be understood that, although the terms first, second, third, etc. may be used herein to describe various elements, and elements should not be limited by these terms. Rather, these terms are only used to distinguish one element from another element. Thus, a first element discussed could be termed a second element without departing from the scope of the present inventive concepts.

The first storage node SN1, the semiconductor photoelectric conversion layer PD, the first transfer transistor TR1, the second transfer transistor TR2, and the floating diffusion region FD may form a first group GA. The reset transistor TRR, the source follower transistor SF, and the select transistor SEL may form a second group GB. In some embodiments, the first group GA may be disposed in the pixel region PR, and the second group GB may be disposed in the pixel transistor forming region PXTR. The first organic photoelectric conversion layer OPD1 may, for example, be disposed only in the pixel region PR or across both the pixel region PR and the pixel transistor forming region PXTR.

The semiconductor photoelectric conversion layer PD may, for example, include a photodiode, a phototransistor, a photogate, a pinned photodiode (PPD), or a combination thereof. The semiconductor photoelectric conversion layer PD and the first organic photoelectric conversion layer OPD1 may detect light of different wavelengths. The semiconductor photoelectric conversion layer PD and the first organic photoelectric conversion layer OPD1 may receive light (e.g., L of FIG. 6) via a microlens (e.g., ML of FIG. 6) and may generate first and second optical signals, respectively, in proportion to the amount of light L incident thereupon.

A first end of the first storage node SN1 may receive a bias signal S1. A second end of the first storage node SN1 may be connected to a first end of the first transfer transistor TR1 and the first organic photoelectric conversion layer OPD1. In some embodiments, the bias signal S1 may be a signal received from outside the unit pixel region PU. Also, in some embodiments, the bias signal S1 may be a signal received from the pixel transistor forming region PXTR. In some embodiments, the bias signal S1 may be a direct current (DC) voltage.

The first end of the first transfer transistor TR1 may be connected to the second end of the first storage node SN1 and the first organic photoelectric conversion layer OPD1, and the second end of the first transfer transistor TR1 may be connected to the floating diffusion region FD. A first transfer gate TG1 of the first transfer transistor TR1 may be gated by a first transfer control signal TX1.

When the first transfer transistor TR1 is off and the bias signal S1 is input to the first storage node SN1, the first storage node SN1 may store a first optical signal, which is electric charge generated by the first organic photoelectric conversion layer OPD1. When the first transfer transistor TR1 is off and the bias signal S1 is input to the first storage node SN1, the reset transistor TRR may reset the floating diffusion region. FD to a power supply voltage $V_{DD}$. The reliability of operation of the image sensor according to some embodiments of the present inventive concept can be secured by resetting the floating diffusion region FD to the power supply voltage $V_{DD}$ when the first optical signal generated by the first organic photoelectric conversion layer OPD1 is stored in the first storage node SN1 and the first transfer transistor TR1, which connects the first storage node SN1 and the floating diffusion region FD, is off.

When the first transfer transistor TR1 is turned on by the first transfer control signal TX1, the first transfer transistor TR1 may transmit the first optical signal stored in the first storage node SN1 to the floating diffusion region FD. The first transfer transistor TR1 may not necessarily be on all the time. In other words, since the first storage node SN1 stores the first optical signal, the first optical signal may be transmitted to the floating diffusion region FD by turning on the first transfer transistor TR1 whenever necessary. Accordingly, the power consumption of the image sensor according to some embodiments of the present inventive concept can be reduced. Also, since the image sensor according to some embodiments of the present inventive concept uses the first storage node SN1 to which the bias signal S1 is always input and the first transfer transistor TR1 corresponding to the first organic photoelectric conversion layer OPD1, the first optical signal can be precisely transmitted to the floating diffusion region FD.

A first end of the second transfer transistor TR2 may be connected to the semiconductor photoelectric conversion layer PD, and a second end of the second transfer transistor TR2 may be connected to the floating diffusion region FD. A second transfer gate TG2 of the second transfer transistor TR2 may be gated by a second transfer control signal TX2. The second transfer transistor TR2 may transmit the second optical signal, which is electric charge generated by the semiconductor photoelectric conversion layer PD, to the floating diffusion region FD in accordance with the second transfer control signal TX2. The first and second transfer transistors TR1 and TR2 may share the floating diffusion region FD. The floating diffusion region FD may receive, and accumulatively store, the first optical signal and/or the second optical signal.

A first end of the reset transistor TRR may be connected to the power supply voltage $V_{DD}$, and a second end of the reset transistor TRR may be connected to the floating diffusion region FD. A reset gate RG of the reset transistor TRR may be gated by a reset control signal RX. The reset transistor TRR may reset the floating diffusion region FD to the power supply voltage $V_{DD}$. A first end of the source follower transistor SF may be connected to the power supply voltage $V_{DD}$, and a second end of the source follower transistor SF may be connected to a first end of the select transistor SEL. The source follower transistor SF may be a driving transistor capable of generating an output voltage Vout by being controlled by the floating diffusion region FD. The source follower transistor SF may be combined with a constant current source located outside the unit pixel region PU and may thus serve as a source follower buffer amplifier. Also, the source follower transistor SF may amplify an electric potential variation in the floating diffusion region FD and may generate the output voltage Vout. The output voltage Vout may be output to the select transistor SEL. The first end of the select transistor SEL may be connected to the second end of the source follower transistor SF, and the second end of the select transistor SEL may be connected to a column line CL. The select transistor SEL may be gated by a select control signal SX. The select transistor SEL may output the output voltage Vout to the column line CL, which is connected to the unit pixel region PU.

Figure 4:
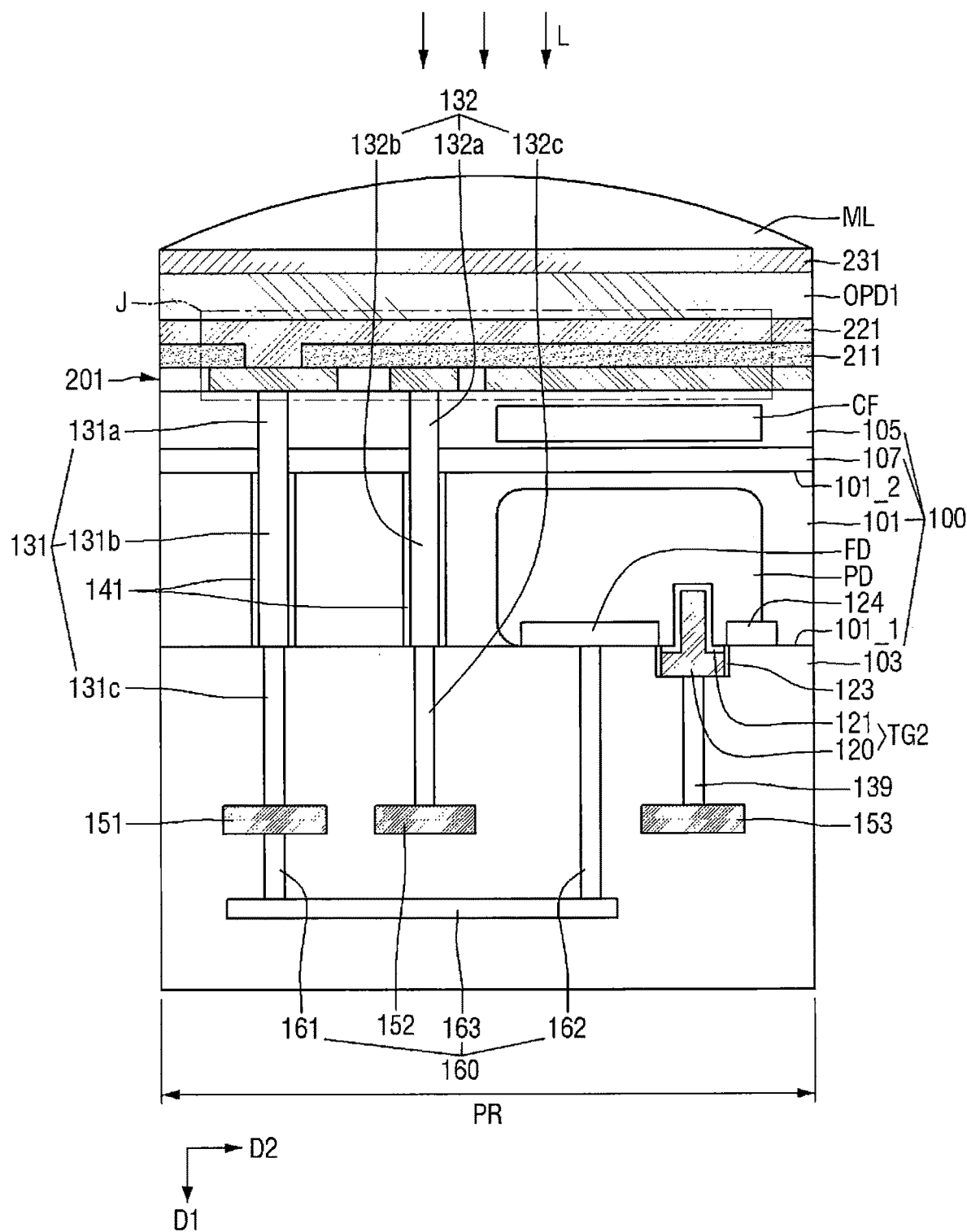
FIGS. 4, 6, 7, 9, 11, 13, and 15 are cross-sectional views illustrating the pixel regions of image sensors according to some embodiments of the present inventive concept.
Figure 5:
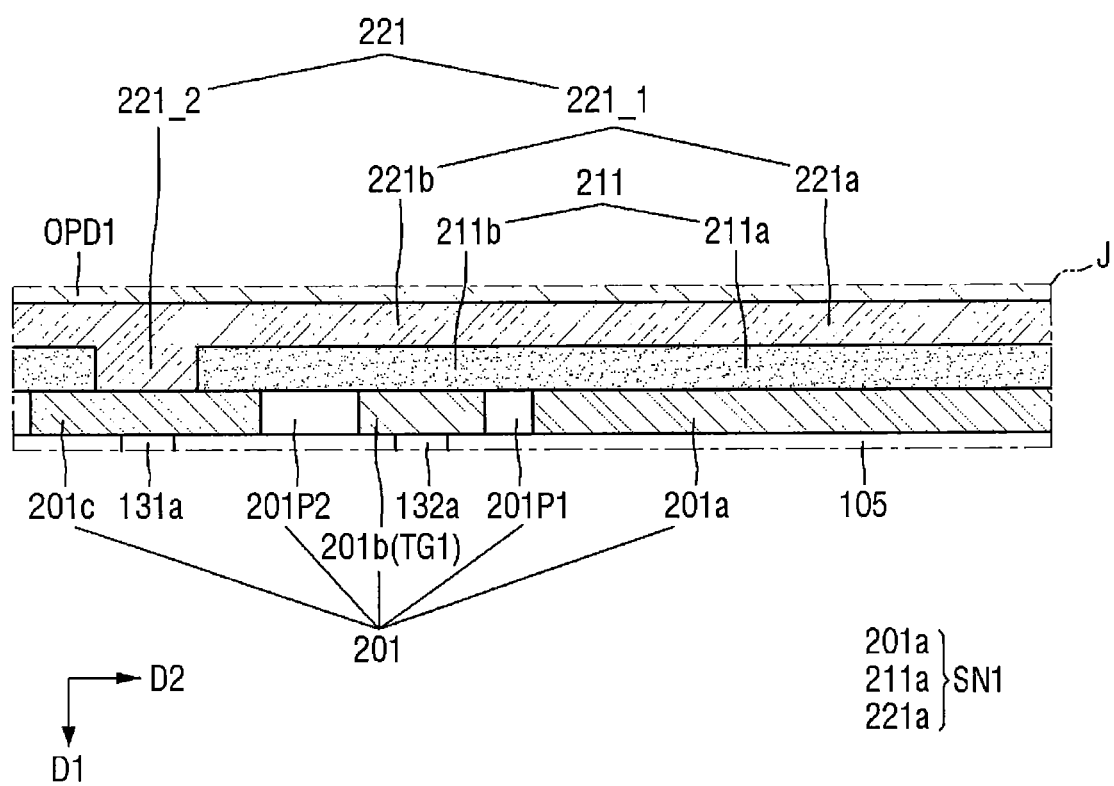
FIG. 5 is an enlarged view illustrating an area J of FIG. 4.

Referring to FIGS. 4 and 5, the image sensor according to some embodiments of the present inventive concept may include the base layer 100, a first insertion layer 201, a first dielectric layer 211, a first semiconductor layer 221, the first organic photoelectric conversion layer OPD1, a first upper electrode layer 231, and the microlens ML.

The first insertion layer 201, the first dielectric layer 211, the first semiconductor layer 221, the first organic photoelectric conversion layer OPD1, the first upper electrode layer 231, and the microlens ML may be disposed on the base layer 100. The base layer 100 may include a first interlayer insulating film 103, a substrate 101, a protective planarization film 107, and a second interlayer insulating film 105. The substrate 101, the protective planarization film 107, and the second interlayer insulating film 105 may be sequentially stacked on the first interlayer insulating film 103.

The substrate 101 may include first and second surfaces 101_1 and 101_2, which are opposite each other. A second surface 101_2 of the substrate 101 may be a surface on which the light L is incident. The substrate 101 may, for example, be a bulk silicon substrate or a silicon-on-insulator (SOI) substrate. In some embodiments, the substrate 101 may be a silicon substrate or may include other materials such as silicon germanium, indium antimonide, a lead tellurium compound, indium arsenide, indium phosphide, gallium arsenide, or gallium antimonide. In some embodiments, the substrate 101 may have an epitaxial layer formed on a base substrate thereof. The substrate 101 will hereinafter be described as being a silicon substrate.

The semiconductor photoelectric conversion layer PD may be disposed in the base layer 100. For example, the semiconductor photoelectric conversion layer PD may be disposed in the substrate 101 of the pixel region PR. The semiconductor photoelectric conversion layer PD may be formed by doping the inside of the substrate 101 with impurities having an opposite conductivity type to that of the substrate 101. The semiconductor photoelectric conversion layer PD may have a difference in the concentration of impurities between upper and lower parts thereof to have a potential gradient along a first direction D1. For example, the semiconductor photoelectric conversion layer PD may be formed by stacking a plurality of impurity regions. Here, the first direction D1 may be a direction facing a first surface 101_1 of the substrate 101 from the second surface 101_2 of the substrate 101.

The floating diffusion region FD may be disposed in the base layer 100. The floating diffusion region FD may be disposed in the substrate 101 on the side of the first surface 101_1 of the substrate 101 of the pixel region PR.

The second transfer gate TG2 may be disposed on the first surface 101_1 of the substrate 101. The floating diffusion region FD may be disposed on one side of the second transfer gate TG2. A source region 124 of the second transfer transistor TR2 may be disposed on the other side of the second transfer gate TG2. The source region 124 of the second transfer transistor TR2 may be disposed in the substrate 101 on the side of the first surface 101_1 of the substrate 101. A drain region of the second transfer transistor TR2 may be the floating diffusion region FD. The second transfer gate TG2 may include a second transfer gate electrode 120 and a second transfer gate insulating film 121.

In some embodiments, the second transfer gate electrode 120 may include first and second portions. The first portion of the second transfer gate electrode 120 may be disposed in the substrate 101. The first portion of the second transfer gate electrode 120 may extend from the first surface 101_1 of the substrate 101 toward the second surface 101_2 of the substrate 101. The first portion of the second transfer gate electrode 120 may be disposed on the second portion of the second transfer gate electrode 120. The second portion of the second transfer gate electrode 120 may protrude from the first surface 101_1 of the substrate 101 in the first direction D1. The second portion of the second transfer gate electrode 120 may be disposed in the first interlayer insulating film 103.

In some embodiments, the width of the first portion of the second transfer gate electrode 120 may be smaller than the width of the second portion of the second transfer gate electrode 120. In some embodiments, the width of the first portion of the second transfer gate electrode 120 may be substantially the same as the width of the second portion of the second transfer gate electrode 120. The widths of the first and second portions of the second transfer gate electrode 120 may be as measured in a second direction D2. The second transfer gate electrode 120 may, for example, include a conductive material. The conductive material may include, for example, doped polysilicon, titanium nitride (TiN), tantalum nitride (TaN), tungsten nitride (WN), titanium (Ti), tantalum (Ta), or tungsten (W), but the present inventive concept is not limited thereto.

The second transfer gate insulating film 121 may be interposed between the second transfer gate electrode 120 and the substrate 101. For example, the second transfer gate insulating film 121 may be disposed between the second portion of the second transfer gate electrode 120 and the first surface 101_1 of the substrate 101 and between the first portion of the second transfer gate electrode 120 and the substrate 101. The second transfer gate insulating film 121 may include, for example, a high-k material. The high-k material may, for example, include hafnium oxide, hafnium silicon oxide, lanthanum oxide, or lanthanum aluminum oxide, but the present inventive concept is not limited thereto. In some embodiments, the second transfer gate insulating film 121 may include a silicon oxide film, a silicon nitride film, or a silicon oxynitride film.

Second transfer gate spacers 123 may be disposed on both sides of the second portion of the second transfer gate electrode 120. The second transfer gate spacers 123 may be disposed in the first interlayer insulating film 103. The second transfer gate spacers 123 may, for example, include at least one of silicon nitride (SiN), silicon oxynitride (SiON), silicon oxide (SiO$_2$), silicon oxycarbonitride (SiOCN), and a combination thereof.

The protective planarization film 107 may be disposed on the second surface 101_2 of the substrate 101. The protective planarization film 107 may be a high-concentration impurity layer and may be formed by doping the substrate 101 with P-type impurities such as boron (B), but the present inventive concept is not limited thereto. In some embodiments, the protective planarization film 107 may be formed using an oxide film having a negative electric charge. The protective planarization film 107 may reduce or possibly prevent generation of depletion wells on a surface thereof adjacent to the substrate 101 due to a lowered electric potential because of, for example, a dangling-bond defect of silicon, a surface defect caused by, for example, etching stress, or an interface trap. Also, the protective planarization film 107 may provide a potential gradient so that photo charge generated near the substrate 101 may flow into the floating diffusion region FD.

The second interlayer insulating film 105 may be disposed on the protective planarization film 107. The second interlayer insulating film 105 may include an insulating material.

A color filter CF may be disposed in the second interlayer insulating film 105 on the protective planarization film 107. The color filter CF may be disposed between the semiconductor photoelectric conversion layer PD and the first organic photoelectric conversion layer OPD1. The color filter CF may transmit light L of a particular wavelength therethrough. For example, the color filter CF may transmit therethrough light L that is not converted into an electrical signal by the first organic photoelectric conversion layer OPD1.

The first insertion layer 201 may be disposed on the second interlayer insulating film 105. The first insertion layer 201 may be disposed between the base layer 100 and the first organic photoelectric conversion layer OPD1. The first insertion layer 201 may include a first electrode layer 201*a*, a first insulating pattern 201P1, a first transfer gate electrode 201*b*, a second insulating pattern 201P2, and a first pad 201*c*. The first electrode layer 201*a* and the first transfer gate electrode 201*b* may be separated by the first insulating pattern 201P1. The first transfer gate electrode 201*b* and the first pad 201*c* may be separated by the second insulating pattern 201P2. The first and second insulating patterns 201P1 and 201P2 may, for example, include the same material as the second interlayer insulating film 105.

The bias signal S1 may be input to the first electrode layer 201*a*. The first electrode layer 201*a* and the first transfer gate electrode 201*b* may, for example, be transparent electrodes. The first electrode layer 201*a* and the first transfer gate electrode 201*b* may, for example, include indium tin oxide (ITO). The first pad 201*c* may include a conductive material.

The first dielectric layer 211 may be disposed between the first organic photoelectric conversion layer OPD1 and the first insertion layer 201. The first dielectric layer 211 may extend between the first electrode layer 201*a* and the first semiconductor layer 221 and may not entirely cover the first pad 201*c*.

The first dielectric layer 211 may include first and second portions 211*a* and 211*b*. The first portion 211*a* of the first dielectric layer 211 may overlap with the first electrode layer 201*a* in the first direction D1. For example, the first portion 211*a* of the first dielectric layer 211 may be a part of the first dielectric layer 211 interposed between the first electrode layer 201*a* and the first semiconductor layer 221. The second portion 211*b* of the first dielectric layer 211 may overlap with the first transfer gate electrode 201*b* in the first direction D1. For example, the second portion 211*b* of the first dielectric layer 211 may be a part of the first dielectric layer 211 interposed between the first transfer gate electrode 201*b* and the first semiconductor layer 221. The first dielectric layer 211 may include a dielectric material. The first dielectric layer 211 may, for example, include one of aluminum oxide, silicon nitride, silicon oxide, and a combination thereof. For example, the first dielectric layer 211 may include one of Al$_2$O$_3$ and SiO$_2$. The first dielectric layer 211 may, for example, include an organic insulator.

The first semiconductor layer 221 may include first and second portions 221_1 and 221_2. The first portion 221_1 of the first semiconductor layer 221 may be disposed on the first dielectric layer 211. The second portion 221_2 of the first semiconductor layer 221 may be a part of the first semiconductor layer 221 inserted into the first dielectric layer 211 from the first portion 221_1 of the first semiconductor layer 221. The second portion 221_2 of the first semiconductor layer 221 may protrude from the first portion 221_1 of the first semiconductor layer 221 toward the base layer 100 in the first direction D1. The second portion 221_2 of the first semiconductor layer 221 may, for example, penetrate the first dielectric layer 211.

The first portion 221_1 of the first semiconductor layer 221 may include first and second regions 221*a* and 221*b*. The first region 221*a* of the first portion 221_1 of the first semiconductor layer 221 may be a part of the first portion 221_1 overlapping with the first electrode layer 201*a* and the first portion 211*a* of the first dielectric layer 211 in the first direction D1. The second region 221*b* of the first portion 221_1 of the first semiconductor layer 221 may be a part of the first portion 221_1 overlapping with the first transfer gate electrode 201*b* and the second portion 211*b* of the first dielectric layer 211 in the first direction D1. The first semiconductor layer 221 may, for example, include a semiconductor material. The first semiconductor layer 221 may, for example, include one of CdSe, CdS, ZnO, SnO$_2$, MoS$_2$, TiO$_2$, Fe$_2$O$_3$, WO$_3$, InGaZnO, ZnO—Rh$_2$O$_3$, In$_2$O$_3$, ZnInO, InGaO, InZnO, ZnSnO, and a combination thereof. The first semiconductor layer 221 may, for example, include indium gallium zinc oxide (IGZO). The first semiconductor layer 221 may, for example, include an organic semiconductor. The first semiconductor layer 221 may, for example, include dibenzothiopheno[6,5-b:6',5'-f]thieno[3,2-b]thiophene (DBTTT).

The first electrode layer 201*a*, the first portion 211*a* of the first dielectric layer 211, and the first region 221*a* of the first portion 221_1 of the first semiconductor layer 221 may be sequentially stacked on the base layer 100 to form the first storage node SN1 of FIG. 3. The first transfer gate electrode 201*b*, the second portion 211*b* of the first dielectric layer 211, and the second region 221*b* of the first portion 221_1 of the first semiconductor layer 221 may be sequentially stacked on the base layer 100 to form the first transfer transistor TR1 of FIG. 3.

The first organic photoelectric conversion layer OPD1 may be disposed on the first semiconductor layer 221. The first organic photoelectric conversion layer OPD1 may, for example, generate an electrical signal (i.e., the first optical signal) in response to light L of a particular color incident thereupon via the microlens ML. For example, the first organic photoelectric conversion layer OPD1 may generate electric charges (e.g., electrons) in response to the light L incident thereupon via the microlens ML. The first organic photoelectric conversion layer OPD1 may, for example, include a non-silicon material such as an organic semiconductor, a quantum dot material, or chalcogenide or an amorphous silicon (a-Si) material.

The first upper electrode layer 231 may be disposed on the first organic photoelectric conversion layer OPD1. For example, different voltages may be input to the first upper electrode layer 231 and the first electrode layer 201a. Also, for example, different voltages may be input to the first upper electrode layer 231 and the first transfer gate electrode 201b. The microlens ML may be disposed on the first upper electrode layer 231. The microlens ML may have a convex shape and may have a predetermined radius of curvature. The microlens ML may be formed of, for example, a light-transmitting resin. The microlens ML can condense the light L into the pixel region PR.

The first interlayer insulating film 103 may be disposed below the first surface 101_1 of the substrate 101. The first interlayer insulating film 103 may include an insulating material. For example, the first interlayer insulating film 103 may include a high density plasma (HDP) layer, a tonen silazene (TOSZ) layer, a spin-on-glass (SOG) layer, or undoped silica glass (USG), but the present inventive concept is not limited thereto. The first interlayer insulating film 103 may include first, second, and third wires 151, 152, and 153, which are disposed in the first interlayer insulating film 103 and are spaced apart from one another. Each of the first, second, and third wires 151, 152, and 153 may include a conductive material.

The first wire 151 may be connected to the first semiconductor layer 221 via a first penetrating electrode 131. The first penetrating electrode 131 may extend through the base layer 100 from the first pad 201c of the first insertion layer 201 to the first wire 151. The first penetrating electrode 131 may be connected to the second portion 221_2 of the first semiconductor layer 221 via the first pad 201c. The first penetrating electrode 131 may, for example, penetrate the second interlayer insulating film 105, the protective planarization film 107, and the substrate 101, and may extend through a part of the first interlayer insulating film 103. The first penetrating electrode 131 may be spaced apart from the first electrode layer 201a and the first transfer gate electrode 201b. The first penetrating electrode 131 may include first, second, and third portions 131a, 131b, and 131c.

The first portion 131a of the first penetrating electrode 131 may be disposed in the second interlayer insulating film 105 and the protective planarization film 107. The first portion 131a of the first penetrating electrode 131 may, for example, be in contact with the first pad 201c. The second portion 131b of the first penetrating electrode 131 may be disposed in the substrate 101. The second portion 131b of the first penetrating electrode 131 may, for example, be surrounded by and/or be around a first insulating film 141. The third portion 131c of the first penetrating electrode 131 may be disposed in the first interlayer insulating film 103. The third portion 131c of the first penetrating electrode 131 may, for example, be in contact with the first wire 151.

The first wire 151 may be connected to the floating diffusion region FD via a first connection wire layer 160. For example, the first wire 151 may be directly connected to a first contact 161. Also, the floating diffusion region FD may be directly connected to a second contact 162. The first and second contacts 161 and 162 may be connected by a first connection wire 163. The first connection wire 163 may, for example, be connected to the second end of the reset transistor TRR of FIG. 3.

The second wire 152 may be connected to the first transfer gate electrode 201b via a second penetrating electrode 132. The first transfer control signal TX1 may be input to the first transfer gate electrode 201b via the second wire 152 and the second penetrating electrode 132. The second penetrating electrode 132 may extend through the base layer 100 from the first transfer gate electrode 201b of the first insertion layer 201 to the second wire 152. The second penetrating electrode 132 may, for example, penetrate the second interlayer insulating film 105, the protective planarization film 107, and the substrate 101, and may extend through a part of the first interlayer insulating film 103. The second penetrating electrode 132 may be spaced apart from the first penetrating electrode 131. The second penetrating electrode 132 may also be spaced apart from the first pad 201c and the first electrode layer 201a. The second penetrating electrode 132 may include first, second, and third portions 132a, 132b, and 132c.

The first portion 132a of the second penetrating electrode 132 may be disposed in the second interlayer insulating film 105 and the protective planarization film 107. The first portion 132a of the second penetrating electrode 132 may, for example, be in contact with the first transfer gate electrode 201b. The second portion 132b of the second penetrating electrode 132 may be disposed in the substrate 101. The second portion 132b of the second penetrating electrode 132 may, for example, be surrounded by and/or be around the first insulating film 141. The third portion 132c of the second penetrating electrode 132 may be disposed in the first interlayer insulating film 103. The third portion 132c of the second penetrating electrode 132 may, for example, be in contact with the second wire 152.

The third wire 153 may be connected to the second transfer gate TG2 via a third contact 139. The third contact 139 may extend in the first interlayer insulating film 103 from the second transfer gate electrode 120 to the third wire 153.

FIG. 4 illustrates that the sidewalls of the first penetrating electrode 131, the sidewalls of the second penetrating electrode 132, and the sidewalls of each of the first, second, and third contacts 161, 162, and 139 are perpendicular to the first surface 101_1 of the substrate 101, but the present inventive concept is not limited thereto. Alternatively, the sidewalls of the first penetrating electrode 131, the sidewalls of the second penetrating electrode 132, and the sidewalls of each of the first, second, and third contacts 161, 162, and 139 may have a predetermined slope with respect to the first surface 101_1 of the substrate 101. Also, the sidewalls of the first portion 131a of the first penetrating electrode 131, the sidewalls of the second portion 131b of the first penetrating electrode 131, and the sidewalls of the third portion 131c of the first penetrating electrode 131 may have different slopes with respect to the first surface 101_1 of the substrate 101. Also, the sidewalls of the first portion 132a of the second penetrating electrode 132, the sidewalls of the second portion 132b of the second penetrating electrode 132, and the sidewalls of the third portion 132c of the second penetrating electrode 132 may have different slopes with respect to the first surface 101_1 of the substrate 101.

FIG. 4 illustrates that the first and second portions 131a and 131b of the first penetrating electrode 131 have the same width, and that the third portion 131c of the first penetrating electrode 131 has a different width from the first and second portions 131a and 131b of the first penetrating electrode 131, but the present inventive concept is not limited thereto. In some embodiments, the first, second, and third portions 131a, 131b, and 131c of the first penetrating electrode 131 may all have different widths. Also, FIG. 4 illustrates that the first and second portions 132a and 132b of the second penetrating electrode 132 have the same width, and that the third portion 132c of the second penetrating electrode 132 has a different width from the first and second portions 132a and 132b of the second penetrating electrode 132, but the present inventive concept is not limited thereto. In some embodiments, the first, second, and third portions 132a, 132b, and 132c of the second penetrating electrode 132 may all have different widths.

The first and second penetrating electrodes 131 and 132 may, for example, include a conductive material. For example, the first and second penetrating electrodes 131 and 132 may include one of tungsten, aluminum, copper, and doped silicon. Also, for example, the first and second penetrating electrodes 131 and 132 may include a combination of a metal material and doped silicon.

The bias signal S1 of FIG. 3 may be input to the first electrode layer 201a of the first storage node SN1 of FIG. 5. In response to the light L being incident upon the microlens ML, the first organic photoelectric conversion layer OPD1 may generate electric charges (e.g., electrons). The electric charges generated by the first organic photoelectric conversion layer OPD1 (i.e., the first optical signal) may be captured in the first region 221a of the first portion 221_1 of the first semiconductor layer 221 of the first storage node SN1 of FIG. 5 due to the bias signal S1 input to the first electrode layer 201a of the first storage node SN1. When the first transfer control signal TX1 is yet to be applied to the first transfer gate electrode 201b, the captured electric charge may not be moved to the second portion 221_2 of the first semiconductor layer 221 due to the barrier of the first transfer gate electrode 201b.

While the electric charges generated by the first organic photoelectric conversion layer OPD1 (i.e., the first optical signal) is captured in the first region 221a of the first portion 221_1 of the first semiconductor layer 221 because of the first transfer control signal TX1 not yet being applied to the first transfer gate electrode 201b, the reset transistor TRR of FIG. 3 may reset the floating diffusion region FD to the power supply voltage $V_{DD}$.

After the floating diffusion region FD is reset, the first transfer control signal TX1 may be input to the first transfer gate electrode 201b via the second wire 152 and the second penetrating electrode 132. The first transfer gate electrode 201b, the second portion 211b of the first dielectric layer 211, and the second region 221b of the first portion 221_1 of the first semiconductor layer 221 may form a metal oxide semiconductor (MOS) transistor (e.g., the first transfer transistor TR1). As the first transfer control signal TX1 is input to the first transfer gate electrode 201b, the barrier of the first transfer gate electrode 201b may be lowered. Due to the lowered barrier of the first transfer gate electrode 201b, the electric charges captured in the first region 221a of the first portion 221_1 of the first semiconductor layer 221 may be moved to the second portion 221_2 of the first semiconductor layer 221 and may be accumulated in the floating diffusion region FD via the first penetrating electrode 131.

In response to the light L being incident upon the microlens ML, the semiconductor photoelectric conversion layer PD may generate electric charges (i.e., the second optical signal). The electric charges generated by the semiconductor photoelectric conversion layer PD may be moved to, and accumulated in, the floating diffusion region FD due to the second transfer control signal TX2 being input via the third wire 153 and the third contact 139.

Since in the image sensor according to some embodiments of the present inventive concept, the first transfer gate electrode 201b is disposed between the base layer 100 and the first dielectric layer 211, the mobility of the electric charge generated by the first organic photoelectric conversion layer OPD1 can be improved. Also, noise can be reduced by moving all the electric charge captured in the first region 221a of the first portion 221_1 of the first semiconductor layer 221 to the second portion 221_2 of the first semiconductor layer 221. Also, by not applying the first transfer control signal TX1 to the first transfer gate electrode 201b, electric charge can be captured in the first region 221a of the first portion 221_1 of the first semiconductor layer 221, and as a result, the precision of the resetting of the floating diffusion region FD can be improved.

Figure 6:
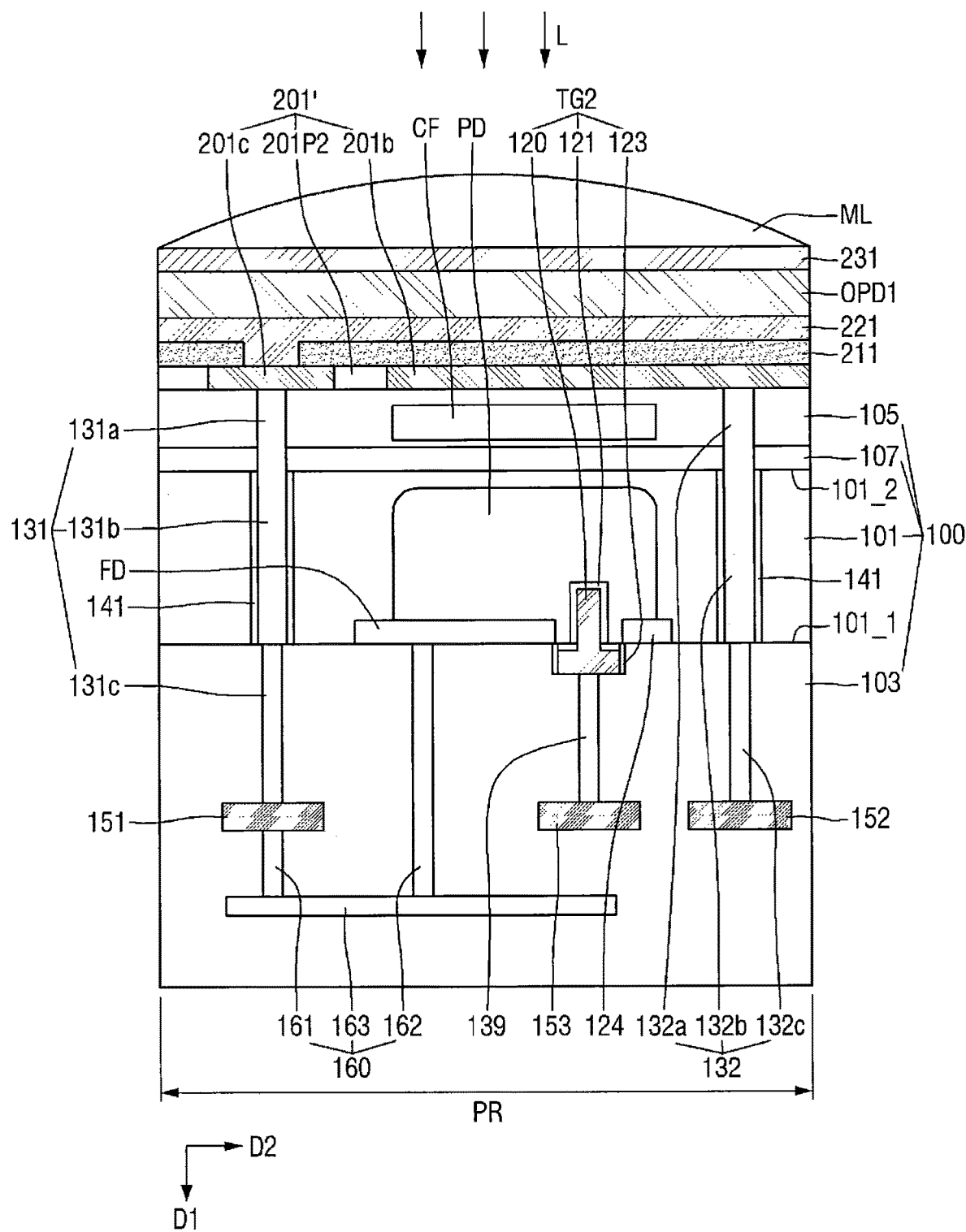

An image sensor according to some embodiments of the present inventive concept will hereinafter be described with reference to FIGS. 2, 3, and 6. For clarity, descriptions of elements or features that have already been described above will be omitted or at least simplified. Referring to FIGS. 2, 3, and 6, a first insertion layer 201' may not include a first electrode layer 201a. A first transfer gate electrode 201b, a first dielectric layer 211, and a first semiconductor layer 221 may form a first storage node SN1 together and may also form a first transfer transistor TR1 together. In response to a bias signal S1 being applied to the first transfer gate electrode 201b, electric charge generated by a first organic photoelectric conversion layer OPD1 may be captured in the first semiconductor layer 221. In response to a first transfer control signal TX1 being applied to the first transfer gate electrode 201b via a second wire 152 and a second penetrating electrode 132, the electric charges generated by the first organic photoelectric conversion layer OPD1 may be moved to a floating diffusion region FD via a first penetrating electrode 131.

Figure 7:
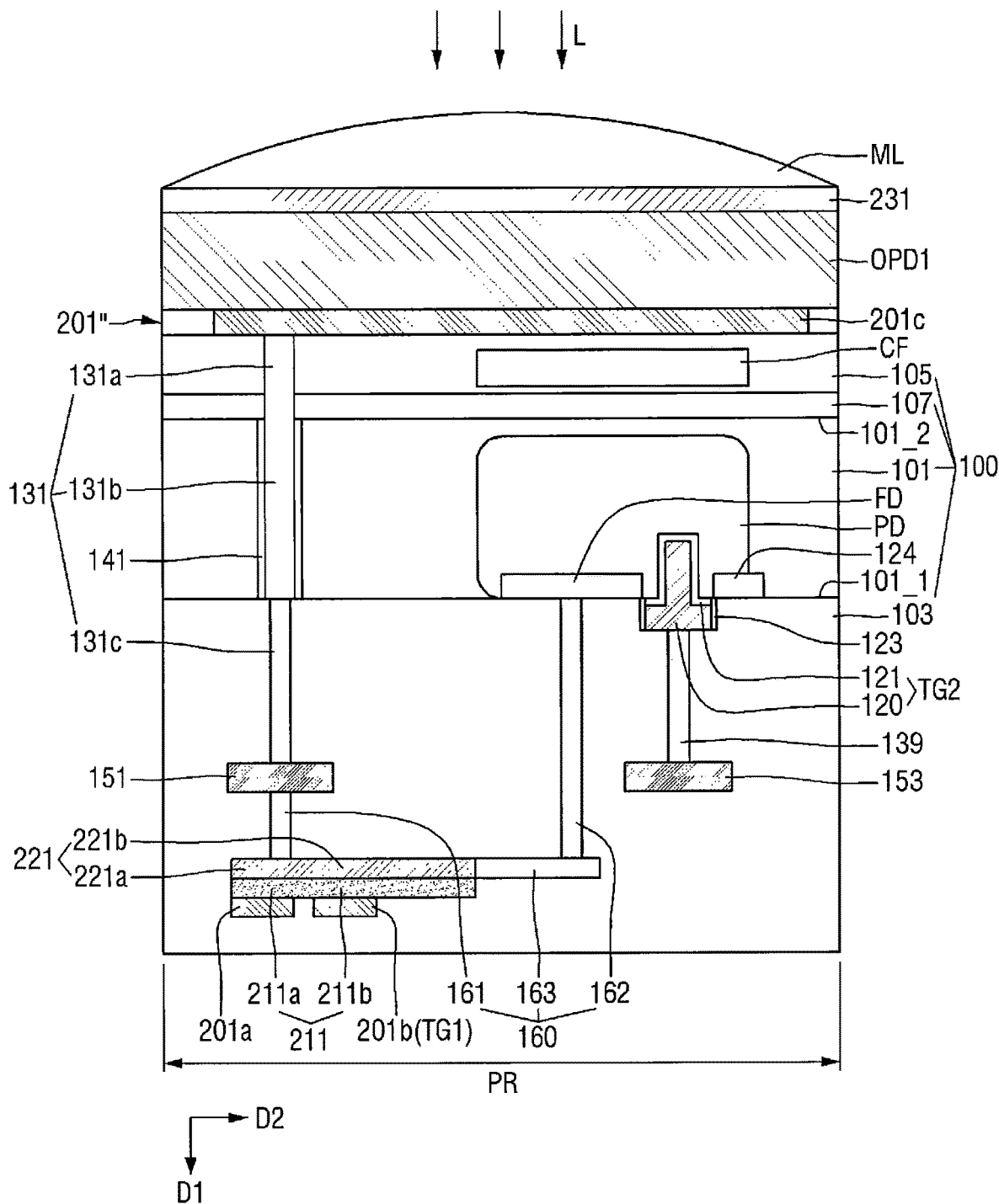

An image sensor according to some embodiments of the present inventive concept will hereinafter be described with reference to FIGS. 2, 3, and 7. For clarity, descriptions of elements or features that have already been described above will be omitted or at least simplified. Referring to FIGS. 2, 3, and 7, a first storage node SN1 and a first transfer transistor TR1 may be disposed in a base layer 100. For example, the first storage node SN1 and the first transfer transistor TR1 may be disposed in a first interlayer insulating film 103. The first storage node SN1 may include a first electrode layer 201a, a first portion 211a of a first dielectric layer 211, and a first region 221a of a first semiconductor layer 221. The first transfer transistor TR1 may include a first transfer gate electrode 201b, a second portion 211b of the first dielectric layer 211, and a second region 221b of the first semiconductor layer 221.

A first insertion layer 201" may include only a first pad 201c. A first penetrating electrode 131 may connect a first organic photoelectric conversion layer OPD1 and the first storage node SN1. For example, a first wire 151 may be connected to the first storage node SN1 via a first contact 161. Accordingly, the first penetrating electrode 131 can electrically connect the first organic photoelectric conversion layer OPD1 and the first storage node SN1 using the first pad 201c, the first wire 151, and the first contact 161.

The first electrode layer 201a and the first transfer gate electrode 201b may be spaced apart from each other and may be disposed in the first interlayer insulating film 103. The first dielectric layer 211 may be disposed on the first electrode layer 201a and the first transfer gate electrode

201b. The first semiconductor layer 221 may be disposed on the first dielectric layer 211. The first semiconductor layer 221 may, for example, be in contact with the first contact 161. The first region 221a of the first semiconductor layer 221 may overlap with the first electrode layer 201a and the first portion 211a of the first dielectric layer 211 in a first direction D1. The second region 221b of the first semiconductor layer 221 may overlap with the first transfer gate electrode 201b and the second portion 221b of the first dielectric layer 211 in the first direction D1.

In some embodiments, the first electrode layer 201a, the first transfer gate electrode 201b, the first dielectric layer 211, and the first semiconductor layer 221 may be formed at the stage of back-end-of-line (BEOL) processing. By forming the first storage node SN1 and the first transfer transistor TR1 in the base layer 100, particularly, in the first interlayer insulating film 103, the threshold voltage of a first transfer gate TG1 can be stabilized.

A second contact 162 and a first connection wire 163 may connect the first transfer transistor TR1 and a floating diffusion region FD using the first semiconductor layer 221.

A bias signal S1 may be input to the first electrode layer 201a of the first storage node SN1. In response to light L being incident upon a microlens ML, the first organic photoelectric conversion layer OPD1 may generate electric charges (e.g., electrons). The electric charges generated by the first organic photoelectric conversion layer OPD1 (i.e., a first optical signal) may be moved to the first region 221a of the first semiconductor layer 221 via the first pad 201c, the first penetrating electrode 131, the first wire 151, and the first contact 161. When a first transfer control signal TX1 is yet to be applied to the first transfer gate electrode 201b, the electric charges generated by the first organic photoelectric conversion layer OPD1 may be captured in the first region 221a of the first semiconductor layer 221 due to the barrier of the first transfer gate electrode 201b.

While the electric charges generated by the first organic photoelectric conversion layer OPD1 are captured in the first region 221a of the first semiconductor layer 221 because of the first transfer control signal TX1 not yet being applied to the first transfer gate electrode 201b, a reset transistor TRR may reset the floating diffusion region FD to a power supply voltage $V_{DD}$.

After the floating diffusion region FD is reset, the first transfer control signal TX1 may be input to the first transfer gate electrode 201b. The first transfer gate electrode 201b, the second portion 211b of the first dielectric layer 211, and the second region 221b of the first semiconductor layer 221 may form a MOS transistor (e.g., the first transfer transistor TR1). As the first transfer control signal TX1 is input to the first transfer gate electrode 201b, the barrier of the first transfer gate electrode 201b may be lowered. Due to the lowered barrier of the first transfer gate electrode 201b, the electric charge captured in the first region 221a of the first semiconductor layer 221 may be moved to, and accumulated in, the floating diffusion region FD via the first connection wire 163 and the second contact 162.

An image sensor according to some embodiments of the present inventive concept will hereinafter be described with reference to FIGS. 2, 8, 9, and 10. For clarity, descriptions of elements or features that have already been described above will be omitted or at least simplified. Referring to FIGS. 2, 8, 9, and 10, the image sensor according to some embodiments of the present inventive concept may further include a third penetrating electrode 133, a second organic photoelectric conversion layer OPD2, a second storage node SN2, and a third transfer transistor TR3. The second storage node SN2 and the third transfer transistor TR3 may be included in a first group GA. A first end of the second storage node SN2 may receive a bias signal S1. A second end of the second storage node SN2 may be connected to a first end of the third transfer transistor TR3 and the second photoelectric conversion layer OPD2.

The first end of the third transfer transistor TR3 may be connected to the second end of the second storage node SN2 and the second organic photoelectric conversion layer OPD2, and a second end of the third transfer transistor TR3 may be connected to a floating diffusion region FD. A third transfer gate TG3 of the third transfer transistor TR3 may be gated by a third transfer control signal TX3.

A first upper electrode layer 231 may be surrounded by and/or be around a third interlayer insulating film 109. A second insertion layer 202 may be disposed on the third interlayer insulating film 109. The second insertion layer 202 may include a second electrode layer 202a, a third insulating pattern 202P1, a third transfer gate electrode 202b, a fourth insulating pattern 202P2, and a second pad 202c. The bias signal S1 may be input to the second electrode layer 202a. The second electrode layer 202a and the third transfer gate electrode 202b may be separated by the third insulating pattern 202P1. The third transfer gate electrode 202b and the second pad 202c may be separated by the fourth insulating pattern 202P2.

The above descriptions of the first electrode layer 201a, the first insulating pattern 201P1, the second insulating pattern 201P2, the first dielectric layer 211, and the first semiconductor layer 221 of FIGS. 4 and 5 may directly apply to the second electrode layer 202a, the third insulating pattern 202P1, the fourth insulating pattern 202P2, the second dielectric layer 212, and the second semiconductor layer 222.

The second electrode layer 202a, a first portion 212a of the second dielectric layer 212, and a first region 222a of a first portion 222_1 of the second semiconductor layer 222 may be sequentially stacked on the third interlayer insulating film 109 to form the second storage node SN2. The third transfer gate electrode 202b, a second portion 212b of the second dielectric layer 212, and a second region 222b of the first portion 222_1 of the second semiconductor layer 222 may be sequentially stacked on the third interlayer insulating film 109 to form the third transfer transistor TR3.

The second optical photoelectric conversion layer OPD2 may be disposed on the second semiconductor layer 222. The second optical photoelectric conversion layer OPD2 may, for example, generate an electrical signal (i.e., a third optical signal) in response to light L of a particular color incident thereupon via a microlens ML. The second organic photoelectric conversion layer OPD2 may react to light L of a color different from the light that a first organic photoelectric conversion layer OPD1 and a semiconductor photoelectric conversion layer PD react to. For example, the second organic photoelectric conversion layer OPD2 may generate electric charges (e.g., electrons) in response to the light L incident thereupon via the microlens ML.

In a case where the image sensor according to some embodiments of the present inventive concept includes the first and second optical photoelectric conversion layers OPD1 and OPD2, the image sensor according to some embodiments of the present inventive concept may not include a color filter.

A second upper electrode layer 232 may be disposed on the second organic photoelectric conversion layer OPD2. For example, different voltages may be input to the second upper electrode layer 232 and the second electrode layer 202a. Also, for example, different voltages may be input to the second upper electrode layer 232 and the third transfer gate electrode 202b. A first penetrating electrode 131 may further include a fourth portion 131d. The fourth portion 131d of the first penetrating electrode 131 may be a part of the first penetrating electrode 131 extending from the second pad 202c to a first pad 201c. The fourth portion 131d of the first penetrating electrode 131 may be disposed in the third interlayer insulating film 109, the first upper electrode layer 231, the first organic photoelectric conversion layer OPD1, and a first semiconductor layer 221. The fourth portion 131d of the first penetrating electrode 131 may be connected to a first portion 131a of the first penetrating electrode 131. The fourth portion 131d of the first penetrating electrode 131 may be surrounded by and/or be around the second insulating film 241.

A first interlayer insulating film 103 may further include a fourth wire 154. The fourth wire 154 may be connected to the third transfer gate electrode 202b via the third penetrating electrode 133. The third transfer control signal TX3 may be input to the third transfer gate electrode 202b via the fourth wire 154 and the third penetrating electrode 133.

The third penetrating electrode 133 may extend from the third transfer gate electrode 202b of the second insertion layer 202 to the fourth wire 154. The third penetrating electrode 133 may be spaced apart from the first penetrating electrode 131 and a second penetrating electrode 132. The third penetrating electrode 133 may include first, second, third, and fourth portions 133a, 133b, 133c, and 133d.

The first portion 133a of the third penetrating electrode 133 may be disposed in a second interlayer insulating film 105 and a protective planarization film 107. The second portion 133b of the third penetrating electrode 133 may be disposed in a substrate 101. The second portion 133b of the third penetrating electrode 133 may, for example, be surrounded by and/or be around a first insulating film 141. The third portion 133c of the third penetrating electrode 133 may be disposed in the first interlayer insulating film 103. The third portion 133c of the third penetrating electrode 133 may, for example, be in contact with the fourth wire 154. The fourth portion 133d of the third penetrating electrode 133 may be disposed in the third interlayer insulating film 109, the first upper electrode layer 231, the first organic photoelectric conversion layer OPD1, the first semiconductor layer 221, a first dielectric layer 211, and a first electrode layer 201a. The fourth portion 133d of the third penetrating electrode 133 may be surrounded by and/or be around a second insulating film 241.

The first and second electrode layers 201a and 202b may be connected by a fourth penetrating electrode 134. The fourth penetrating electrode 134 may penetrate the third interlayer insulating film 109.

Figure 8:
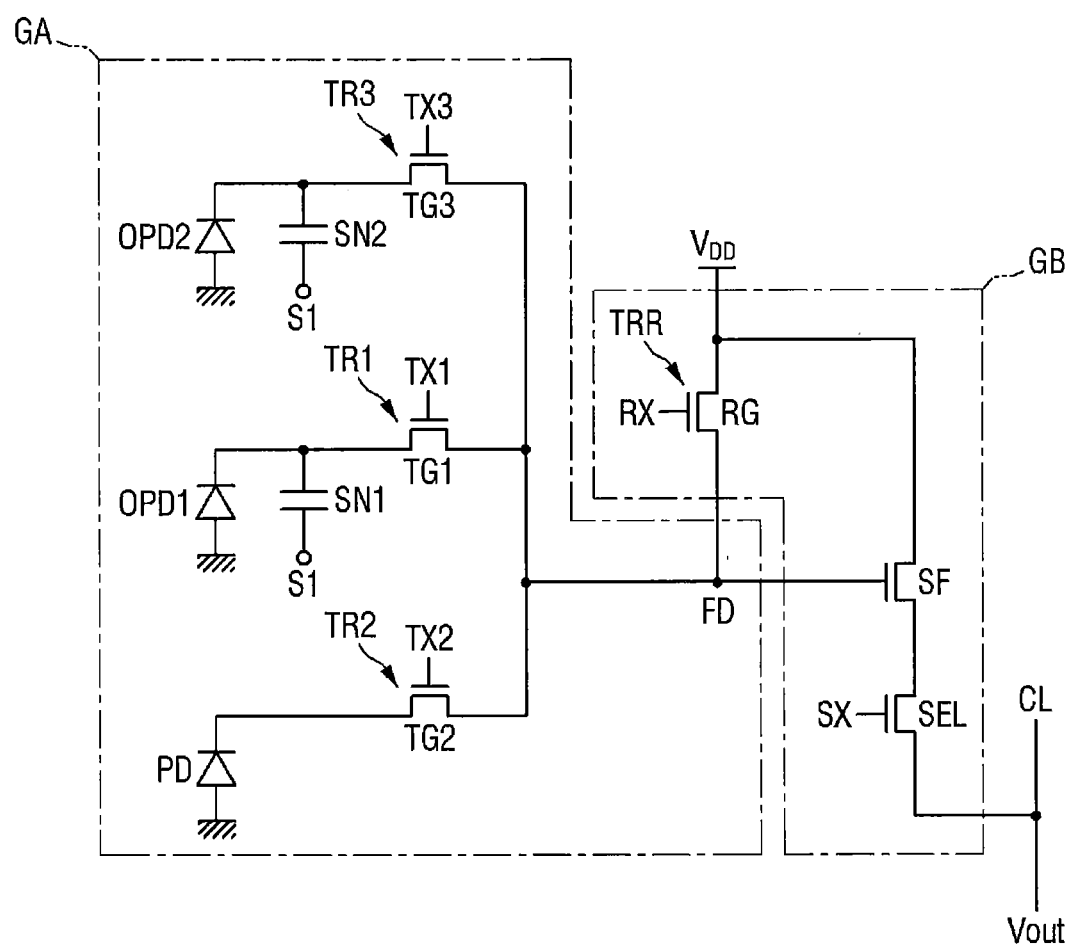
Figure 9:
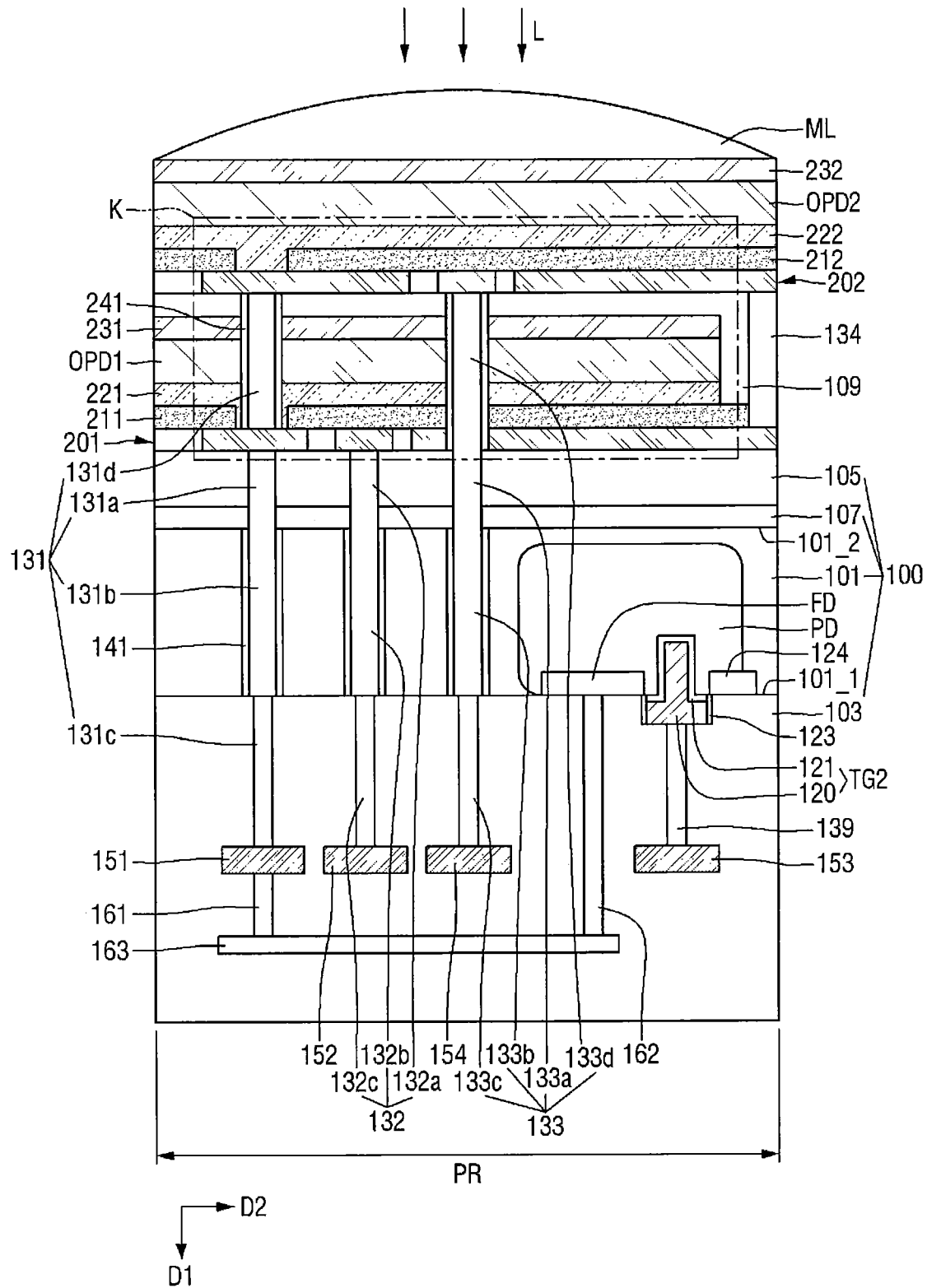
Figure 10:
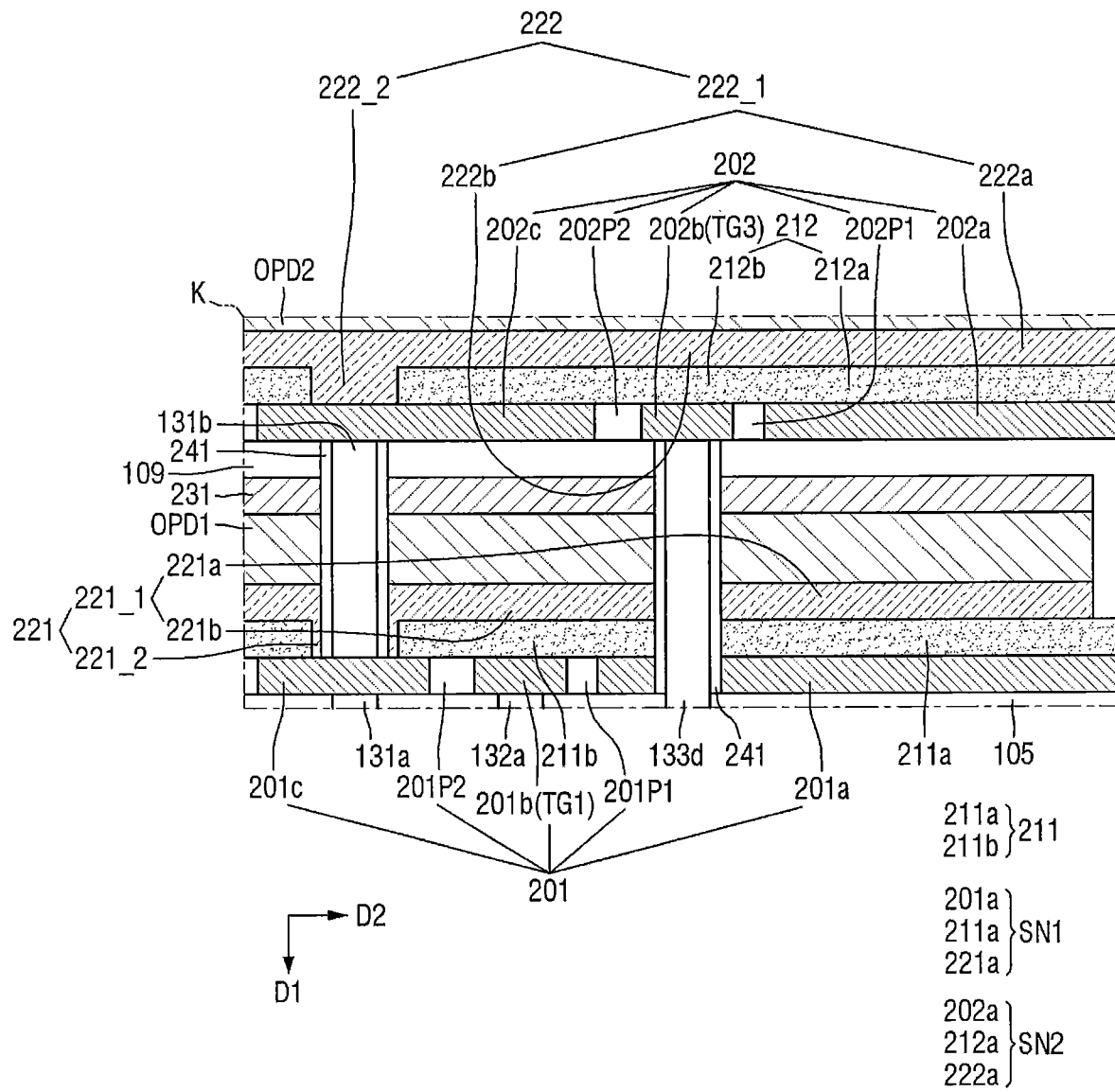
FIG. 10 is an enlarged view illustrating an area K of FIG. 9.
Figure 11:
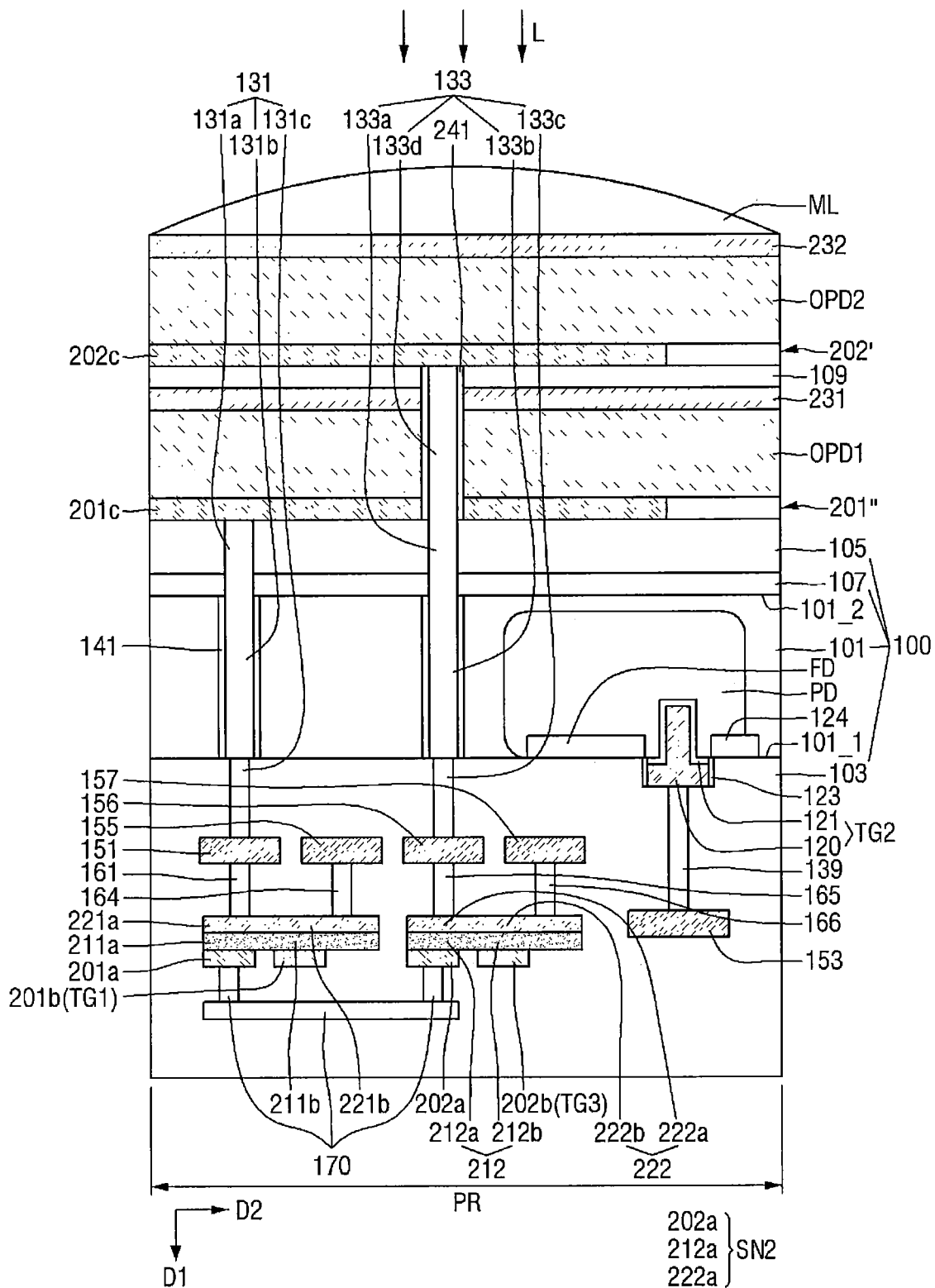

An image sensor according to some embodiments of the present inventive concept will hereinafter be described with reference to FIGS. 2, 8, and 11. For clarity, descriptions of elements or features that have already been described above will be omitted or at least simplified. Referring to FIGS. 2, 8, and 11, a second storage node SN2 and a third transfer transistor TR3 may be disposed in a base layer 100. For example, the second storage node SN2 and the third transfer transistor TR3 may be disposed in a first interlayer insulating film 103. The second storage node SN2 may include a second electrode layer 202a, a first portion 212a of a second dielectric layer 212, and a first region 222a of a second semiconductor layer 222. The third transfer transistor TR3 may include a third transfer gate electrode 202b, a second portion 212b of the second dielectric layer 212, and a second region 222b of the second semiconductor layer 222.

A second insertion layer 202' may include only a second pad 202c. A second interlayer insulating film 105 may not include a color filter. The bias signal S1 may be input to a first electrode layer 201a and the second electrode layer 202a via a second connection wire layer 170.

A third penetrating electrode 133 may connect a second organic photoelectric conversion layer OPD2 and a second storage node SN2. For example, a sixth wire 156 in a first interlayer insulating film 103 may be connected to the second storage node SN2 via a fifth contact 165. Accordingly, the third penetrating electrode 133 may connect the second organic photoelectric conversion layer OPD2 and the second storage node SN2 using the sixth wire 156 and the fifth contact 165.

The above descriptions of the first electrode layer 201a, the first transfer gate electrode 201b, the first dielectric layer 211, and the first semiconductor layer 221 of FIG. 7 may directly apply to the second electrode layer 202a, the third transfer gate electrode 202b, the second dielectric layer 212, and the second semiconductor layer 222.

In some embodiments, the second electrode layer 202a, the third transfer gate electrode 202b, the second dielectric layer 212, and the second semiconductor layer 222 may be formed at the stage of BEOL processing.

A first semiconductor layer 221 of a first storage node SN1 may be connected to a fifth wire 155 via a fourth contact 164. The second semiconductor layer 222 of the second storage node SN2 may be connected to a seventh wire 157 via a sixth contact 166. The fifth and seventh wires 155 and 157 may be connected to a floating diffusion region FD via the first and second semiconductor layers 221 and 222, respectively.

An image sensor according to some embodiments of the present inventive concept will hereinafter be described with reference to FIGS. 2 and 12 through 14. For clarity, descriptions of elements or features that have already been described above will be omitted or at least simplified. Referring to FIGS. 2 and 12 through 14, the image sensor according to some embodiments of the present inventive concept may further include a fifth penetrating electrode 135, a third organic photoelectric conversion layer OPD3, a third storage node SN3, and a fourth transfer transistor TR4. The base layer 100 may include a first interlayer insulating film 103, but may not include a substrate 101 and a second interlayer insulating film 105.

The third storage node SN3 and the fourth transfer transistor TR4 may be included in a first group GA. A first end of the third storage node SN3 may receive a bias signal S1. A second end of the third storage node SN3 may be connected to the third organic photoelectric conversion layer OPD3 and a first end of the fourth transfer transistor TR4.

A first end of the fourth transfer transistor TR4 may be connected to the second end of the third storage node SN3 and the third organic photoelectric conversion layer OPD3, and a second end of the fourth transfer transistor TR4 may be connected to a floating diffusion region FD. A fourth transfer gate TG4 of the fourth transfer transistor TR4 may be gated by a fourth transfer control signal TX4.

A second upper electrode layer 232 may be surrounded by and/or be around a fourth interlayer insulating film 110. A third insertion layer 203 may be disposed on the fourth interlayer insulating film 110. The third insertion layer 203 may include a third electrode layer 203a, a fifth insulating pattern 203P1, a fourth transfer gate electrode 203b, a sixth insulating pattern 203P2, and a third pad 203c. The bias signal S1 may be input to the third electrode layer 203a. The third electrode layer 203a and the fourth transfer gate electrode 203b may be separated by the fifth insulating pattern 203P1. The fourth transfer gate electrode 203b and the third pad 203c may be separated by the sixth insulating pattern 203P2.

The above descriptions of the first electrode layer 201a, the first insulating pattern 201P1, the second insulating pattern 202P2, the first dielectric layer 211, and the first semiconductor layer 221 of FIGS. 4 and 5 may directly apply to the third electrode layer 203a, the fifth insulating pattern 203P1, the sixth insulating pattern 203P2, a third dielectric layer 213, and a third semiconductor layer 223.

The third electrode layer 203a, a first portion 213a of the third dielectric layer 213, and a first region 223a of a first portion 223_1 of the third semiconductor layer 223 may be sequentially stacked on the fourth interlayer insulating film 110 to form the third storage node SN3. The fourth transfer gate electrode 203b, a second portion 213b of the third dielectric layer 213, and a second region 223b of the first portion 223_1 of the third semiconductor layer 223 may be sequentially stacked on the fourth interlayer insulating film 110 to form the fourth transfer transistor TR4.

The third optical photoelectric conversion layer OPD3 may be disposed on the third semiconductor layer 223. The third optical photoelectric conversion layer OPD3 may, for example, generate an electrical signal (i.e., a fourth optical signal) in reaction to light L of a particular color incident thereupon via a microlens ML. The third optical photoelectric conversion layer OPD3 may react to light L of a color different from the light that first and second organic photoelectric conversion layers OPD1 and OPD2 react to. For example, the third optical photoelectric conversion layer OPD3 may generate electric charge (e.g., electrons) in reaction to the light L incident thereupon via the microlens ML.

In a case where the image sensor according to some embodiments of the present inventive concept includes the first, second, and third optical photoelectric conversion layers OPD1, OPD2, and OPD3, the image sensor according to some embodiments of the present inventive concept may not include a color filter.

A third upper electrode layer 233 may be disposed on the third organic photoelectric conversion layer OPD3. For example, different voltages may be input to the third upper electrode layer 233 and the third electrode layer 203a. Also, for example, different voltages may be input to the third upper electrode layer 233 and the fourth transfer gate electrode 203b.

A first penetrating electrode 131 may include third, fourth, and fifth portions 131c, 131d, and 131e, but may not include first and second portions 131a and 131b. The fifth portion 131e of the first penetrating electrode 131 may be a part of the first penetrating electrode 131 extending from the third pad 203c to a second pad 201c. The fifth portion 131e of the first penetrating electrode 131 may be disposed in the fourth interlayer insulating film 110, the second upper electrode layer 232, the second organic photoelectric conversion layer OPD2, a second semiconductor layer 222, and a second dielectric layer 212. The fifth portion 131e of the first penetrating electrode 131 may be connected to the fourth portion 131d of the first penetrating electrode 131 via the second pad 201c. The fifth portion 131e of the first penetrating electrode 131 may be surrounded by and/or be around a third insulating film 341. The first penetrating electrode 131 may be connected to the first, second, and third organic photoelectric conversion layers OPD1, OPD2, and OPD3 via the third, fourth, and fifth portions 131c, 131d, and 131e, respectively. Electric charge generated by the first, second, and third organic photoelectric conversion layers OPD1, OPD2, and OPD3 may be accumulated in a first wire 151 via the first penetrating electrode 131. The first, third and fourth transfer transistors TR1, TR3 and TR4 are electrically connected the floating diffusion region FD via the first penetrating electrode 131 and the first wire 151.

A second penetrating electrode 132 may include only a third portion 132c. A first transfer gate electrode 201b and a second wire 152 may be directly connected by the third portion 132c of the second penetrating electrode 132. A third penetrating electrode 133 may include third and portions 133c and 133d, but may not include first and second portions 133a and 133b. A fourth penetrating electrode 134 may include first, second, and third portions 134a, 134b, and 134c. The first portion 134a of the fourth penetrating electrode 134 may extend between the third electrode layer 203a and a second electrode layer 202a. The second portion 134b of the fourth penetrating electrode 134 may extend between the second electrode layer 202a and a first electrode layer 201a. The third portion 134c of the fourth penetrating electrode 134 may extend between a ninth wire 159 in the first interlayer insulating film 103 and the first electrode layer 201a. The bias signal S1 may be input to the first, second, and third electrode layers 201a, 202a, and 203a via the fourth penetrating electrode 134.

The fifth penetrating electrode 135 may extend from the fourth transfer gate electrode 203b to an eighth wire 158 in the first interlayer insulating film 103. The eighth wire 158 may be connected to the fourth transfer gate electrode 203b via the fifth penetrating electrode 135. A fourth transfer control signal TX4 may be input to the fourth gate electrode 203b via the eighth wire 158 and the fifth penetrating electrode 135. The fifth penetrating electrode 135 may be spaced apart from the first, second, third, and fourth penetrating electrodes 131, 132, 133, and 134. The fifth penetrating electrode 135 may include first, second, and third portions 135a, 135b, and 135c.

The first portion 135a of the fifth penetrating electrode 135 may be disposed in the fourth interlayer insulating film 110, the second upper electrode layer 232, the second organic photoelectric conversion layer OPD2, the second semiconductor layer 222, the second dielectric layer 212, and the second electrode layer 202a. The second portion 135b of the fifth penetrating electrode 135 may be disposed in a third interlayer insulating film 109, a first upper electrode layer 231, the first organic photoelectric conversion layer OPD1, a first semiconductor layer 221, a first dielectric layer 211, and the first electrode layer 201a. The first and second portions 135a and 135b of the fifth penetrating electrode 135 may be surrounded by and/or be around a fourth insulating film 441. The third portion 135c of the fifth penetrating electrode 135 may be disposed in the first interlayer insulating film 103. The third portion 135c of the fifth penetrating electrode 135 may, for example, be in contact with the eighth wire 158.

The base layer 100 has been described above with reference to FIG. 13 as including only the first interlayer insulating film 103, but the present inventive concept is not limited thereto. For example, the base layer 100 may further include a second interlayer insulating film 105 disposed on the first interlayer insulating film 103. In this example, a first insertion layer 201 may be disposed on the second interlayer insulating film 105, and the first, second, third, fourth, and/or fifth penetrating electrodes 131, 132, 133, 134, and/or 135 may penetrate the second interlayer insulating film 105 to extend into the first interlayer insulating film 103.

Figure 12:
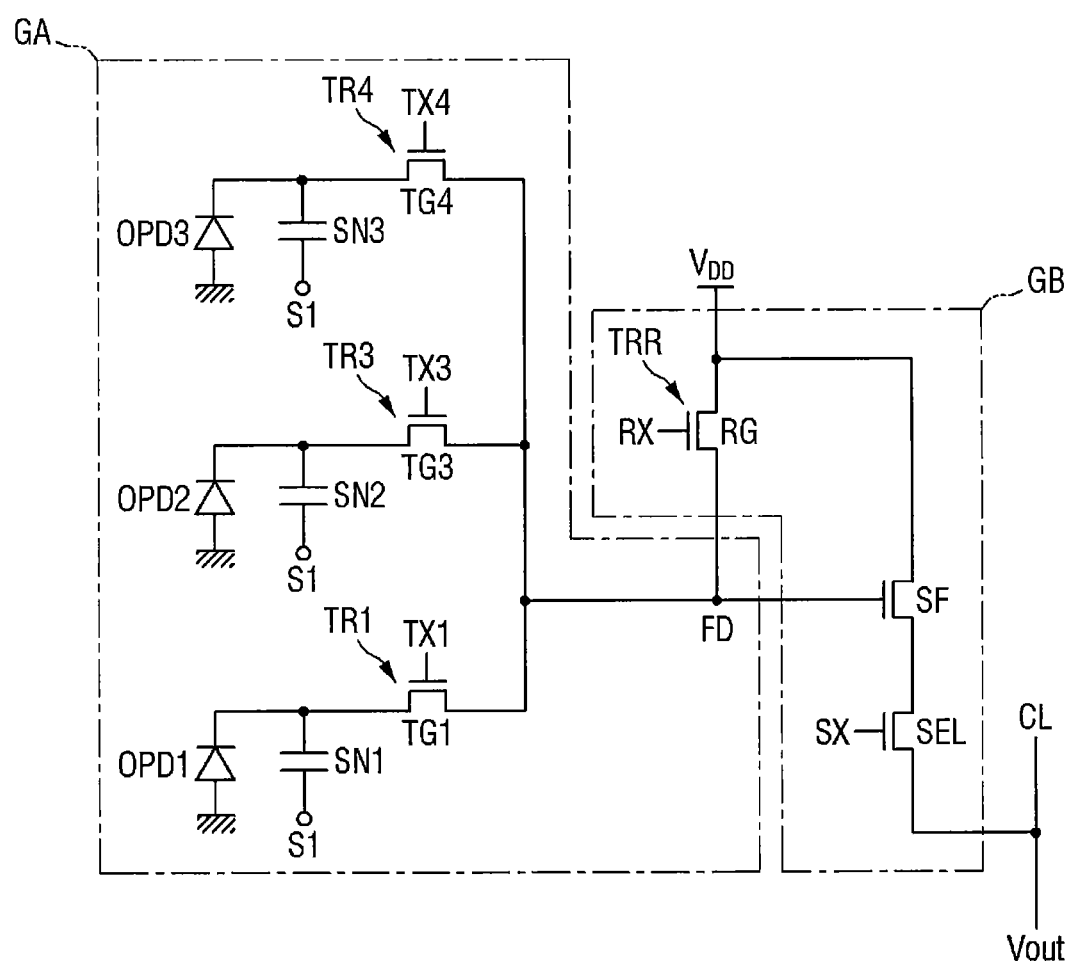
Figure 13:
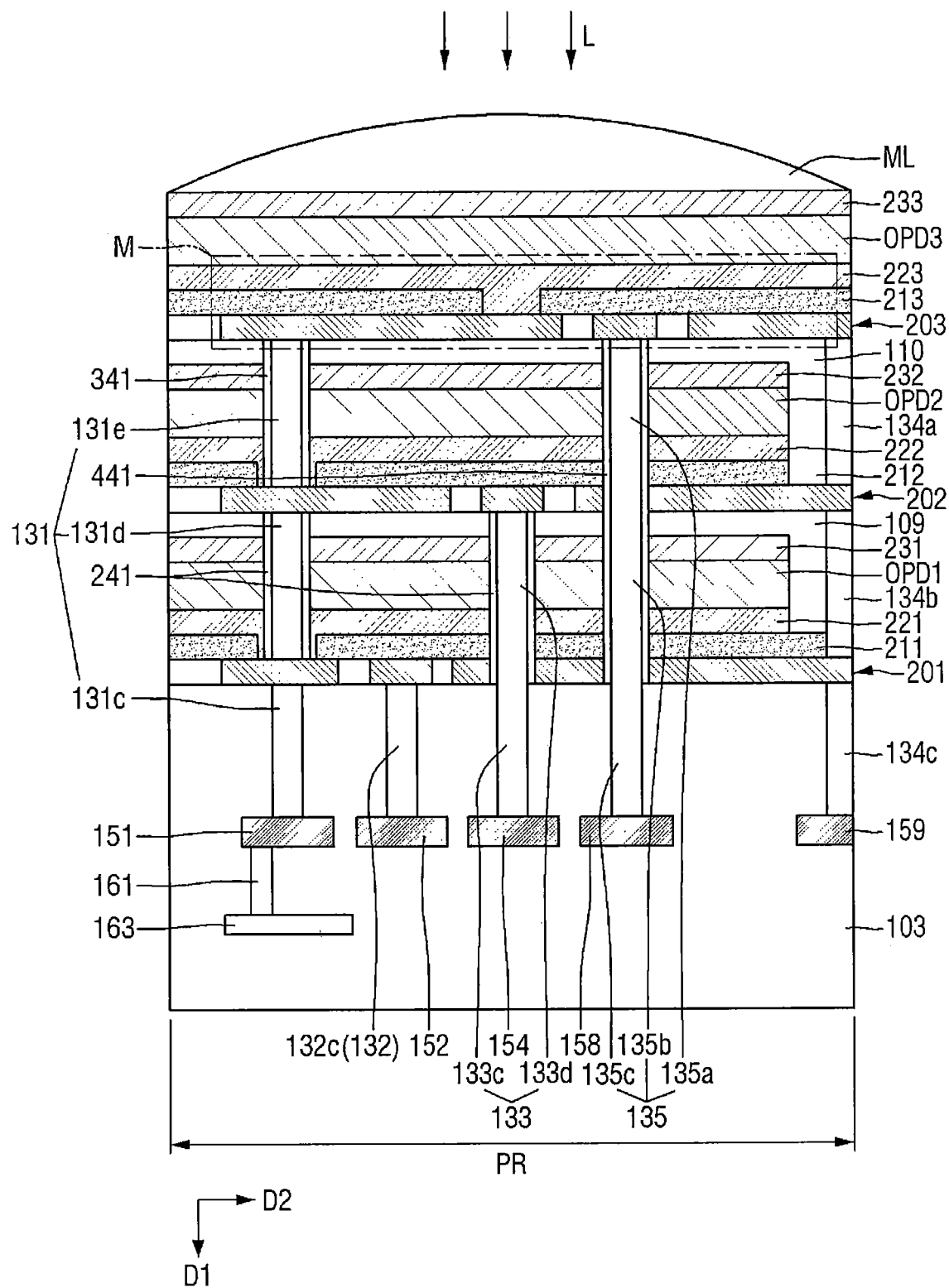
Figure 14:
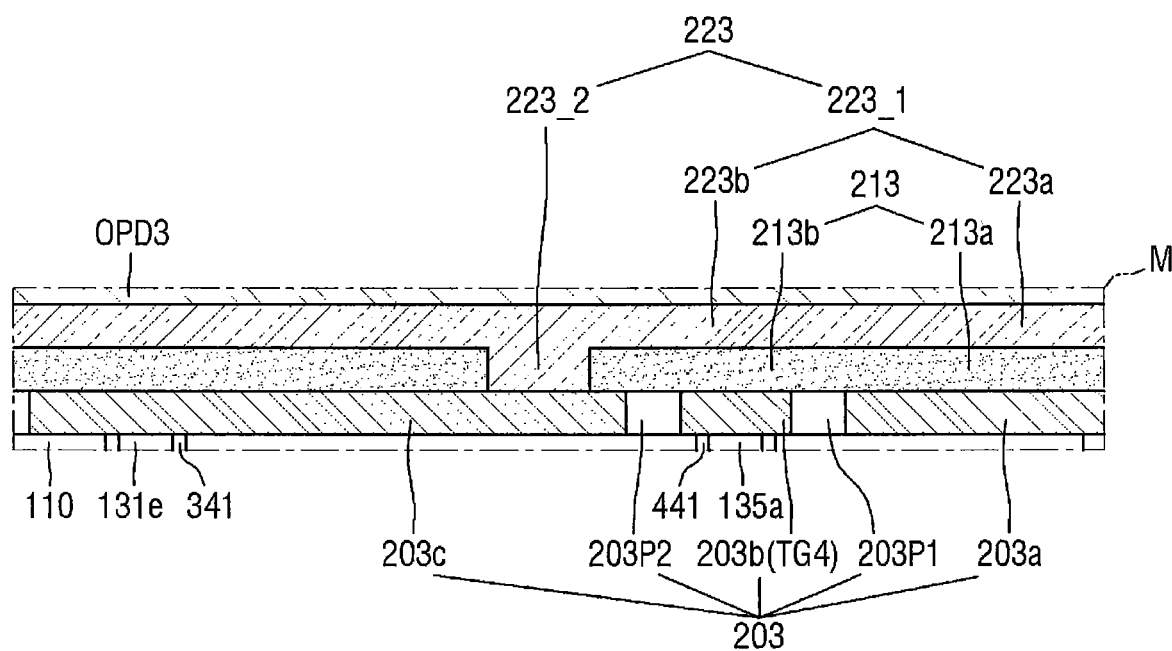
FIG. 14 is an enlarged view illustrating an area M of FIG. 13.
Figure 15:
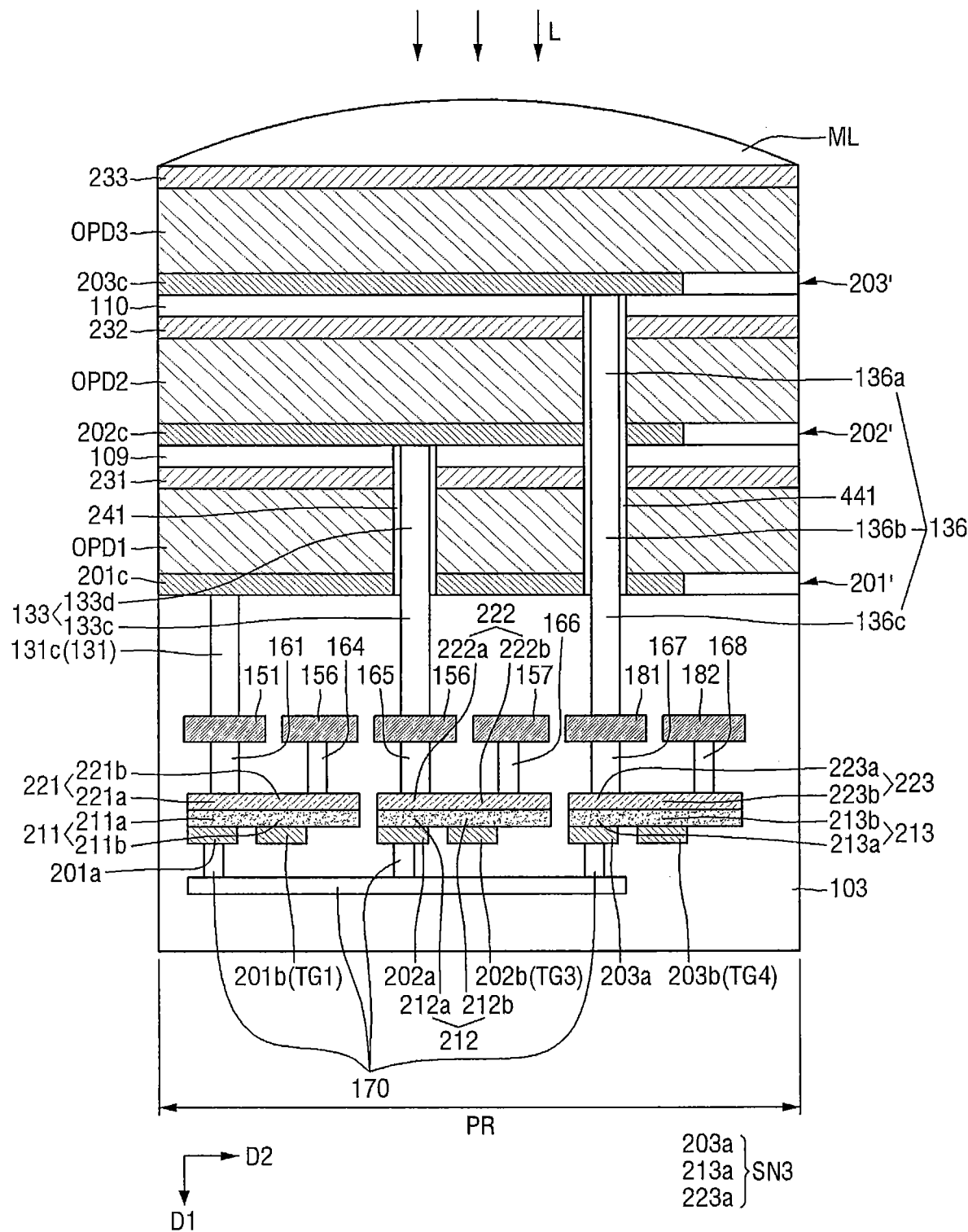

An image sensor according to some embodiments of the present inventive concept will hereinafter be described with reference to FIGS. 2, 12, and 15. For clarity, descriptions of elements or features that have already been described above will be omitted or at least simplified. Referring to FIGS. 2, 12, and 15, a third storage node SN3 and a fourth transfer transistor TR4 may be disposed in a base layer 100. For example, the third storage node SN3 and the fourth transfer transistor TR4 may be disposed in a first interlayer insulating film 103. The third storage node SN3 may include a third electrode layer 203a, a first portion 213a of a third dielectric layer 213, and a first region 223a of a third semiconductor layer 223. The fourth transfer transistor TR4 may include a fourth transfer gate electrode 203b, a second portion 213b of the third dielectric layer 213, and a second region 223b of the third semiconductor layer 223.

A third insertion layer 203' may include only a third pad 203c. A bias signal S1 may be input to a first electrode layer 201a, a second electrode layer 202a, and the third electrode layer 203a via a second connection wire layer 170.

A sixth penetrating electrode 136 may connect a third organic photoelectric conversion layer OPD3 and the third storage node SN3. For example, a tenth wire 181 in the first interlayer insulating film 103 may be connected to the third storage node SN3 via a seventh contact 167. Accordingly, the sixth penetrating electrode 136 may connect the third organic photoelectric conversion layer OPD3 and the third storage node SN3 using the tenth wire 181 and the seventh contact 167.

The above descriptions of the first electrode layer 201a, the first transfer gate electrode 201b, the first dielectric layer 211, and the first semiconductor layer 221 of FIG. 7 may directly apply to the third electrode layer 203a, the fourth transfer gate electrode 203b, the third dielectric layer 213, and the third semiconductor layer 223.

In some embodiments, the third electrode layer 203a, the fourth transfer gate electrode 203b, the third dielectric layer 213, and the third semiconductor layer 223 may be formed at the stage of BEOL processing. The third semiconductor layer 223 of the third storage node SN3 may be connected to an eleventh wire 182 via an eighth contact 168. The fifth, seventh, and eleventh wires 155, 157, and 182 may be connected to a second end of a reset transistor TRR via the first, second, and third semiconductor layers 221, 222, and 223, respectively. In some embodiments, the fifth, seventh and eleventh wires 155, 157 and 182 may be connected to the floating diffusion region FD via the first, second and third semiconductor layers 221, 222 and 223, respectively.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. An image sensor comprising:
a first organic photoelectric conversion layer on a base layer;
a floating diffusion region in the base layer;
a first storage node comprising a first electrode layer which is configured to receive a bias signal, a first portion of a first semiconductor layer, and a first portion of a first dielectric layer, wherein the first dielectric layer extends between the first electrode layer and the first semiconductor layer, and wherein the first storage node is electrically connected to the first organic photoelectric conversion layer; and
a first transfer transistor comprising a second portion of the first dielectric layer, a second portion of the first semiconductor layer, and a first transfer gate electrode which is configured to receive a first transfer control signal,
wherein the first transfer transistor is electrically connected to the first storage node and the floating diffusion region.

2. The image sensor of claim 1, further comprising:
a semiconductor photoelectric conversion layer in the base layer; and
a second transfer transistor having a first end electrically connected to the semiconductor photoelectric conversion layer and a second end electrically connected to the floating diffusion region.

3. The image sensor of claim 1,
wherein the first transfer gate electrode and the first electrode layer are spaced apart from each other between the base layer and the first organic photoelectric conversion layer,
wherein the image sensor further comprises a first penetrating electrode extending in the base layer from the first semiconductor layer to a first wire in the base layer and a second penetrating electrode extending in the base layer from the first transfer gate electrode to a second wire in the base layer,
wherein the first and second wires are spaced apart from each other,
wherein the first and second penetrating electrodes are spaced apart from each other, and
wherein the first penetrating electrode is electrically connected to the floating diffusion region via a connection wire layer.

4. The image sensor of claim 3,
wherein the second portion of the first dielectric layer is between the first transfer gate electrode and the first organic photoelectric conversion layer and the first portion of the first dielectric layer is between the first electrode layer and the first organic photoelectric conversion layer,
wherein a third portion of the first semiconductor layer is projected from the second portion of the first semiconductor layer toward the base layer, and
wherein the first penetrating electrode extends from the third portion of the first semiconductor layer.

5. The image sensor of claim 3, wherein the first transfer control signal is configured to be input to the first transfer gate electrode via the second wire and the second penetrating electrode.

6. The image sensor of claim 3, further comprising:
a semiconductor photoelectric conversion layer in the base layer; and
a second transfer transistor having a first end electrically connected to the semiconductor photoelectric conversion layer and a second end electrically connected to the floating diffusion region,
wherein the base layer comprises a first interlayer insulating film comprising the first wire, the second wire, and the connection wire layer, a substrate comprising the semiconductor photoelectric conversion layer and the floating diffusion region on the first interlayer insulating film, and a second interlayer insulating film which is between the substrate and the first transfer gate electrode and between the substrate and the first electrode layer, and wherein the second interlayer insulating film comprises a color filter.

7. The image sensor of claim 3, further comprising:
a second organic photoelectric conversion layer on the first organic photoelectric conversion layer;
a second electrode layer to which the bias signal is input, wherein the second electrode layer is between the first and second organic photoelectric conversion layers;
a second transfer gate electrode between the first and second organic photoelectric conversion layers and spaced apart from the second electrode layer;
a second dielectric layer on the second electrode layer and the second transfer gate electrode;
a second semiconductor layer comprising a first portion between the second dielectric layer and the second organic photoelectric conversion layer, and a second portion that is projected from the first portion toward the first organic photoelectric conversion layer, wherein the second semiconductor layer comprises a semiconductor material;
a third penetrating electrode penetrating the first organic photoelectric conversion layer, the first semiconductor layer, the first dielectric layer, and the first electrode layer to extend in the base layer from the second transfer gate electrode to a third wire in the base layer; and
a fourth penetrating electrode extending from the second semiconductor layer to penetrate the first organic photoelectric conversion layer and the first semiconductor layer, and electrically connected to the first penetrating electrode,
wherein the third penetrating electrode is spaced apart from the first and second penetrating electrodes.

8. The image sensor of claim 1,
wherein the first transfer gate electrode and the first storage node are on the base layer,
wherein the first electrode layer is spaced apart from the first transfer gate electrode,
wherein the first dielectric layer and the first semiconductor layer are sequentially stacked on the first transfer gate electrode, and
wherein the image sensor further comprises a first penetrating electrode electrically connecting the first organic photoelectric conversion layer and the first storage node and extending into the base layer.

9. The image sensor of claim 8, further comprising:
a semiconductor photoelectric conversion layer in the base layer; and
a second transfer transistor having a first end electrically connected to the semiconductor photoelectric conversion layer and a second end electrically connected to the floating diffusion region.

10. The image sensor of claim 9, wherein the floating diffusion region is electrically connected to the first semiconductor layer via a connection wire layer.

11. The image sensor of claim 8, further comprising:
a second organic photoelectric conversion layer on the first organic photoelectric conversion layer;
a second storage node comprising a second electrode layer which is in the base layer and is spaced apart from the first transfer gate electrode and the first storage node, a second dielectric layer which is on the second electrode layer, and a second semiconductor layer which is on the second dielectric layer and comprises a semiconductor material; and
a second penetrating electrode penetrating the base layer to connect the second organic photoelectric conversion layer and the second storage node and spaced apart from the first penetrating electrode; and
a second transfer transistor comprising the second dielectric layer, the second semiconductor layer, and a second transfer gate electrode to which a second transfer control signal is input, the second transfer transistor having a first end electrically connected to the second storage node and a second end electrically connected to the floating diffusion region,
wherein the second storage node is configured to receive the bias signal, and
wherein the second electrode layer and the second transfer gate electrode are spaced apart from each other.

12. The image sensor of claim 1, wherein the first semiconductor layer comprises indium gallium zinc oxide (IGZO).

13. An image sensor comprising:
a first organic photoelectric conversion layer on a base layer;
a first transfer gate electrode on the base layer;
a first storage node on the base layer and comprising a first electrode layer, a first semiconductor layer and a first dielectric layer which extends between the first electrode layer and the first semiconductor layer; and
a penetrating electrode extending through the base layer to connect the first organic photoelectric conversion layer and the first storage node,
wherein the first electrode layer is spaced apart from the first transfer gate electrode, and
wherein the first dielectric layer and the first semiconductor layer are stacked on the first transfer gate electrode.

14. The image sensor of claim 13, further comprising:
a semiconductor photoelectric conversion layer in the base layer on the first storage node; and
a second transfer transistor having a first end electrically connected to the semiconductor photoelectric conversion layer and a second end electrically connected to a floating diffusion region,
wherein the floating diffusion region is electrically connected to the first semiconductor layer.

15. The image sensor of claim 14,
wherein the first transfer gate electrode, to which a first transfer control signal is input, the first dielectric layer, and the first semiconductor layer form a first transfer transistor, and
the first transfer transistor has a first end electrically connected to the first storage node and a second end electrically connected to the floating diffusion region.

16. An image sensor comprising:
a first organic photoelectric conversion layer on a base layer;
an insertion layer between the base layer and the first organic photoelectric conversion layer;
a first dielectric layer between the first organic photoelectric conversion layer and the insertion layer;
a first semiconductor layer between the first dielectric layer and the first organic photoelectric conversion layer;
a first penetrating electrode extending from the insertion layer into the base layer to be electrically connected to a first wire in the base layer; and a second penetrating electrode extending from the insertion layer into the base layer to be electrically connected to a second wire in the base layer, wherein the second penetrating electrode is spaced apart from the first penetrating electrode.

17. The image sensor of claim 16, wherein the insertion layer comprises a first transfer gate electrode and a first electrode layer, and a first insulating pattern, the first insulating pattern separating the first transfer gate electrode and the first electrode layer, wherein the first penetrating electrode is spaced apart from the first transfer gate electrode and the first electrode layer, and wherein the second penetrating electrode is electrically connected to the first transfer gate electrode and is spaced apart from the first electrode layer.

18. The image sensor of claim 17, wherein the insertion layer further comprises a pad and a second insulating pattern, wherein the pad is electrically connected to the first semiconductor layer, and the pad is separated from the first transfer gate electrode by the second insulating pattern, and wherein the first penetrating electrode is electrically connected to the first semiconductor layer via the pad.

19. The image sensor of claim 17, further comprising:

a semiconductor photoelectric conversion layer in the base layer;

a floating diffusion region in the base layer; and a second transfer transistor comprising a first end electrically connected to the semiconductor photoelectric conversion layer and a second end electrically connected to the floating diffusion region.

20. The image sensor of claim 16, wherein the insertion layer comprises a first electrode layer and a pad which are separated by a first insulating pattern, wherein the first penetrating electrode is electrically connected to the first semiconductor layer via the pad, and wherein the second penetrating electrode is electrically connected to the first electrode layer.

* * * * *